United States Patent
Lee

(10) Patent No.: US 9,666,809 B2
(45) Date of Patent: May 30, 2017

(54) COMPOUND AND ORGANIC LIGHT-EMITTING DEVICE INCLUDING THE SAME

(71) Applicant: Samsung Display Co., Ltd., Yongin, Gyeonggi-Do (KR)

(72) Inventor: Jung-Sub Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 254 days.

(21) Appl. No.: 14/221,024

(22) Filed: Mar. 20, 2014

(65) Prior Publication Data

US 2015/0155497 A1    Jun. 4, 2015

(30) Foreign Application Priority Data

Dec. 3, 2013    (KR) .................... 10-2013-0149498

(51) Int. Cl.
*H01L 51/00* (2006.01)
*H01L 51/50* (2006.01)

(52) U.S. Cl.
CPC ...... *H01L 51/0058* (2013.01); *H01L 51/0061* (2013.01); *H01L 51/0067* (2013.01); *H01L 51/0071* (2013.01); *H01L 51/0072* (2013.01); *H01L 51/0081* (2013.01); *H01L 51/0085* (2013.01); *H01L 51/0087* (2013.01); *H01L 51/0088* (2013.01); *H01L 51/5016* (2013.01)

(58) Field of Classification Search
None
See application file for complete search history.

(56) References Cited

U.S. PATENT DOCUMENTS

| 2006/0113905 | A1* | 6/2006 | Nakamura | .......... H01L 27/3244 |
| | | | | 313/511 |
| 2011/0127513 | A1 | 6/2011 | Lee et al. | |
| 2013/0069049 | A1 | 3/2013 | Park et al. | |
| 2014/0332758 | A1* | 11/2014 | Kwong | .............. H01L 51/0061 |
| | | | | 257/40 |

FOREIGN PATENT DOCUMENTS

| KR | 10-2011-0042127 A | 4/2011 |
| KR | 10-2011-0066766 A | 6/2011 |
| KR | 10-2011-0092262 A | 8/2011 |
| KR | 10-2011-0093055 A | 8/2011 |
| KR | 10-2011-0113297 A | 10/2011 |
| KR | 10-2011-0116635 A | 10/2011 |
| KR | 10-2011-0134581 A | 12/2011 |
| KR | 10-2013-0076842 A | 7/2013 |
| WO | WO 2011/099718 A1 | 8/2011 |
| WO | WO 2011/126225 A1 | 10/2011 |
| WO | WO 2011/132866 A1 | 10/2011 |

* cited by examiner

*Primary Examiner* — J. L. Yang
(74) *Attorney, Agent, or Firm* — Knobbe Martens Olson & Bear LLP

(57) ABSTRACT

An organic light-emitting device including a first electrode, a second electrode and an organic layer disposed between the first electrode and the second electrode is provided.

19 Claims, 1 Drawing Sheet

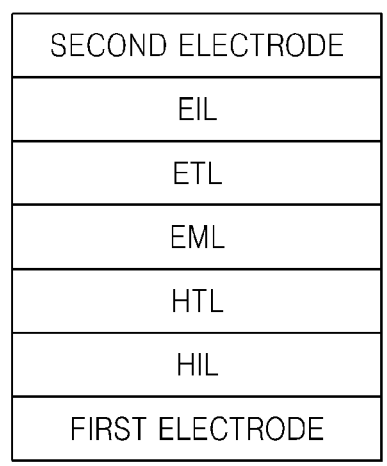

COMPOUND AND ORGANIC LIGHT-EMITTING DEVICE INCLUDING THE SAME

INCORPORATION BY REFERENCE TO ANY PRIORITY APPLICATIONS

Any and all priority claims identified in the Application Data Sheet, or any correction thereto, are hereby incorporated by reference under 37 CFR 1.57. For example, this application claims the benefit of Korean Patent Application No. 10-2013-0149498, filed on Dec. 3, 2013, in the Korean Intellectual Property Office, the disclosure of which is incorporated herein in its entirety by reference.

BACKGROUND

Field

This disclosure relates to a compound and an organic light-emitting device including the same.

Description of the Related Technology

Organic light emitting devices are self-emission devices that have wide viewing angles, high contrast ratios, short response time, and excellent brightness, driving voltage, and response speed characteristics, and produce full-color images.

A typical organic light-emitting device has a structure including a substrate, and an anode, a hole transport layer, an emission layer, an electron transport layer, and a cathode which are sequentially stacked on the substrate. The hole transport layer, the emission layer, and the electron transport layer are organic thin films formed of organic compounds.

An organic light-emitting device having operates by generating light.

When a voltage is applied between the anode and the cathode, holes injected from the anode pass the hole transport layer and migrate toward the emission layer, and electrons injected from the cathode pass the electron transport layer and migrate toward the emission layer. Carriers, such as holes and electrons, are recombined in the emission layer to produce excitons. Then, the excitons are transitioned from an excited state to a ground state, thereby generating light.

A material that has excellent electric stability, high charge transport capability or luminescent capability, high glass transition temperature, and high crystallization prevention capability is desirable.

In determining luminescent efficiency, a critical factor for organic light-emitting devices is a luminescent material. As a luminescent material, fluorescent materials are being widely used. However, according to the mechanism of electric luminescence, in theory, development of phosphorescent materials may lead to a 4-fold increase in luminescent efficiency. Iridium (III) complex-based phosphorescent materials such as $(acac)Ir(btp)_2$, $Ir(PPY)_3$, and Firpic may be used for red, green, and blue emission, respectively.

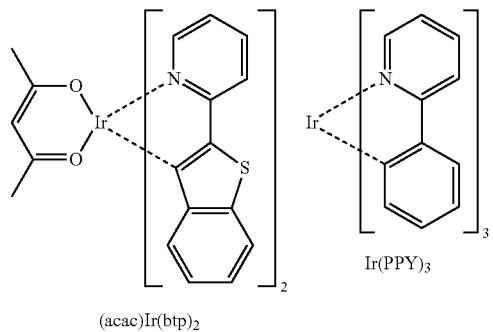

(acac)Ir(btp)$_2$    Ir(PPY)$_3$

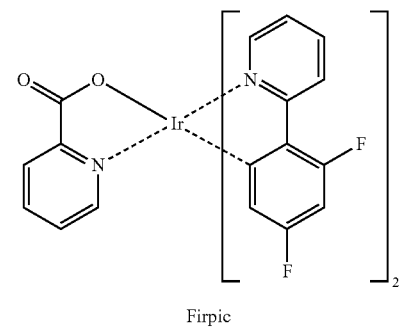

Firpic 4,4'-N,N'-dicarbazole-biphenyl (CBP) is one example of a phosphorescent host material is widely.

Although advantageous in terms of light-emitting characteristics existing light-emitting materials may have low glass transition temperature and thus may be deteriorated during high-temperature deposition under vacuum. For an OLED, power efficiency=($\pi$/voltage)×current efficiency. Since power efficiency is in reverse proportion to voltage, higher power efficiency is needed to obtain a lower consumption power of an OLED. An OLED using a phosphorescent luminescent material has higher current efficiency (cd/A) than an OLED using a fluorescent luminescent material, but when BAlq or CBP is used as a phosphorescent luminescent material host, compared to an OLED using a fluorescent material, a formed OLED may have high driving voltage, thereby showing a relatively low power efficiency (lm/w).

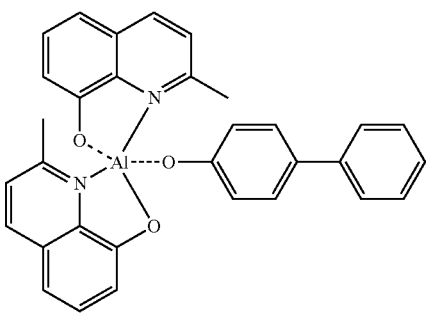

BAlQ

-continued

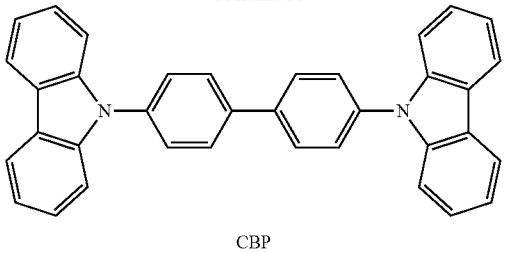

CBP

Also, the an OLED using such material may have unsatisfactory lifetime characteristics. Accordingly, there is a demand for the development of a host material with excellent performance.

SUMMARY

One or more embodiments of the present disclosure include a compound that has excellent electric characteristics, a high charge transporting capability, a high light-emitting capability, a high glass transition temperature, and a crystallization-preventing capability, and that is suitable for use as a luminescent material, and an organic light-emitting device that has high efficiency, low voltage, high brightness, long lifespan due to the inclusion of the material.

According to an aspect of the present embodiments, provided is a compound represented by Formula 1:

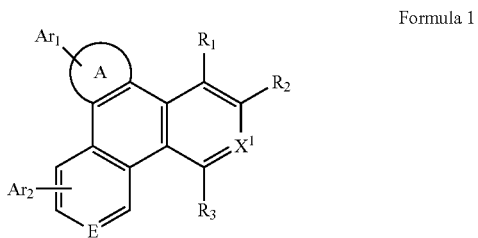

wherein in Formula 1,

A is a fused $C_3$ to $C_8$ aryl ring or a fused $C_1$ to $C_8$ heteroaryl ring;

E and $X^1$ are each independently CH or N (nitrogen);

$R_1$ to $R_3$ are each independently a hydrogen, a deuterium, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group, or optionally $R_1$ and $R_2$ together with the atoms to which they are attached is a ring; and $Ar_1$ and $Ar_2$ are each independently a hydrogen, a deuterium, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group, provided E and $X^1$ are not both CH.

According to another aspect of the present embodiments, provided is an organic light-emitting device including: a first electrode; a second electrode; and an organic layer disposed between the first electrode and the second electrode, wherein the organic layer includes the compound.

According to another aspect of the present embodiments, provided is a flat panel display apparatus including the organic light-emitting device, wherein the first electrode of the organic light-emitting device is electrically connected to a source electrode or a drain electrode of a thin film transistor.

BRIEF DESCRIPTION OF THE DRAWING

These and/or other aspects will become apparent and more readily appreciated from the following description of the embodiments, taken in conjunction with the drawing.

FIG. 1 is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Some embodiments provide a compound represented by Formula 1:

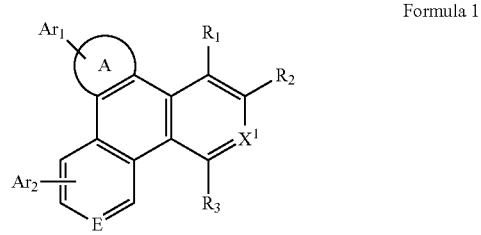

A is a fused $C_3$ to $C_8$ aryl ring or a fused $C_1$ to $C_8$ heteroaryl ring, E and $X^1$ are each independently CH or N (nitrogen), $R_1$ to $R_3$ are each independently a hydrogen atom, a deuterium atom, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group, or optionally $R_1$ and $R_2$ together with the atoms to which they are attached is a ring; and $Ar_1$ and $Ar_2$ are each independently a hydrogen, a deuterium, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group, provided E and $X^1$ are not both CH.

Some embodiments provide an organic luminescent compound that provides, compared to a conventional host material, high luminescent efficiency and long device lifespan, and has a robust skeleton with an appropriate color coordinate, and an organic luminescent device having high efficiency and long-lifespan due to the inclusion of a novel organic luminescent compound as a luminescent material.

Aspects of embodiments of Formula 1 will now be described in detail.

In an aspect, ring A in Formula 1 may be a thiophene moiety or an imidazole moiety.

In an aspect, when $R_1$ and $R_2$ in Formula 1 bind to each other to form a ring, the ring may be a heteroaryl ring.

In an aspect, Formula 1 may be Formula 2:

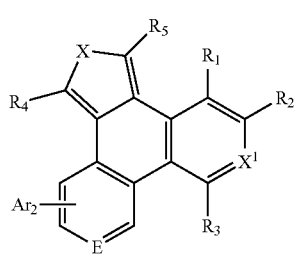

Formula 2

X in Formula 2 is S (sulfur) or $NR_{100}$; and $R_4$, $R_5$, and $R_{100}$ may be each independently a hydrogen, a deuterium, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group.

In an aspect, Formula 1 may be Formula 3:

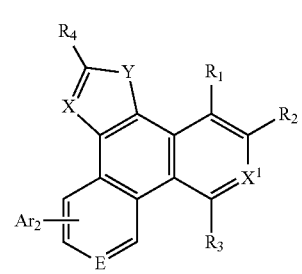

Formula 3

X and Y in Formula 3 are each independently S (sulfur), N (nitrogen), or $NR_{100}$; and $R_4$ and $R_{100}$ may be each independently a hydrogen, a deuterium, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group.

In an aspect, Formula 1 may be Formula 4:

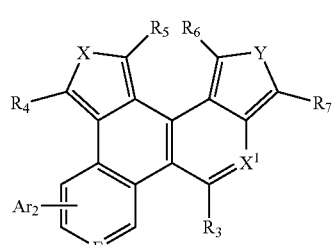

Formula 4

X and Y in Formula 4 are each independently S (sulfur) or $NR_{100}$; and $R_4$ to $R_7$, and $R_{100}$ may be each independently a hydrogen, a deuterium, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group.

In an aspect, Formula 1 may be Formula 5:

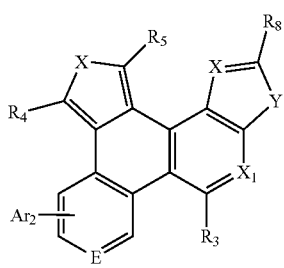

Formula 5

X and Y in Formula 5 are S (sulfur), N (nitrogen), or $NR_{100}$; and $R_4$, $R_5$, $R_8$, and $R_{100}$ may be each independently a hydrogen, a deuterium, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group.

In an aspect, $Ar_2$ and $R_3$ in Formula 1 may be a hydrogen or a deuterium.

In an aspect, $R_4$ and $R_5$ in Formula 2 may be each independently one of Formulae 2a to 2e:

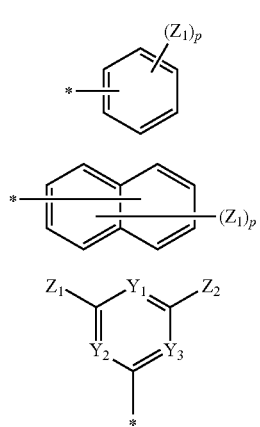

2a

2b

2c

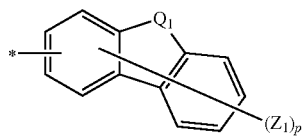

2d

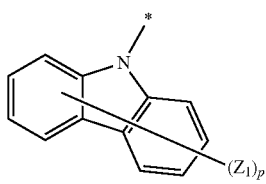

2e wherein in Formulae 2a to 2e, $Q_1$ is S (sulfur), $CR_{51}R_{52}$, or $NR_{53}$, $Y_1$ to $Y_3$ are each independently CH or N (nitrogen), $Z_1$, $Z_2$, $R_{51}$, $R_{52}$, and $R_{53}$ are each independently a hydrogen, a deuterium, a substituted or unsubstituted $C_1$ to $C_{20}$ alkyl group, a substituted or unsubstituted $C_6$ to $C_{20}$ aryl group, a substituted or unsubstituted $C_1$ to $C_{20}$ heteroaryl group, a substituted or unsubstituted $C_6$ to $C_{20}$ condensed polycyclic group, a halogen atom, a cyano group, a nitro group, a hydroxy group or a carboxy group, p is an integer of 1 to 8, and * indicates an attachment position.

In an aspect, $R_1$ and $R_2$ in Formula 2 may be each independently a hydrogen or a deuterium.

In an aspect, $R_4$ in Formula 3 may be Formula 3a:

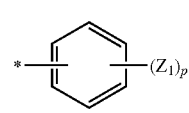

3a $Z_1$ in Formula 3a is a hydrogen, a deuterium, a substituted or unsubstituted $C_1$ to $C_{20}$ alkyl group, a substituted or unsubstituted $C_6$ to $C_{20}$ aryl group, a substituted or unsubstituted $C_1$ to $C_{20}$ heteroaryl group, a substituted or unsubstituted $C_6$ to $C_{20}$ condensed polycyclic group, a halogen atom, a cyano group, a nitro group, a hydroxy group, or a carboxy group; p is an integer of 1 to 5; and * indicates an attachment position.

In an aspect, $R_{100}$ in Formula 3 may be one of Formulae 4a to 4c:

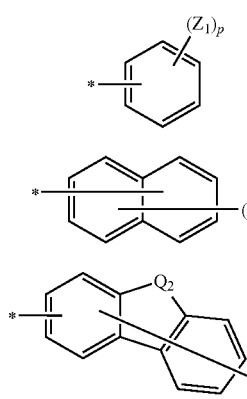

4a

4b

4c wherein in Formulae 4a to 4c, $Q_2$ may be S (sulfur), $CR_{51}R_{52}$, or $NR_{53}$; $Z_1$, $R_{51}$, $R_{52}$, and $R_{53}$ are each independently a hydrogen, a deuterium, a substituted or unsubstituted $C_1$ to $C_{20}$ alkyl group, a substituted or unsubstituted $C_6$ to $C_{20}$ aryl group, a substituted or unsubstituted $C_1$ to $C_{20}$ heteroaryl group, a substituted or unsubstituted $C_6$ to $C_{20}$ condensed polycyclic group, a halogen atom, a cyano group, a nitro group, a hydroxy group, or a carboxy group; p is an integer of 1 to 7; and * indicates a binding site.

In an aspect, $R_1$ and $R_2$ in Formula 3 may be each independently a hydrogen or a deuterium.

In an aspect, $R_4$, $R_5$, $R_6$, and $R_7$ in Formula 4 may be each independently one of Formulae 5a to 5c:

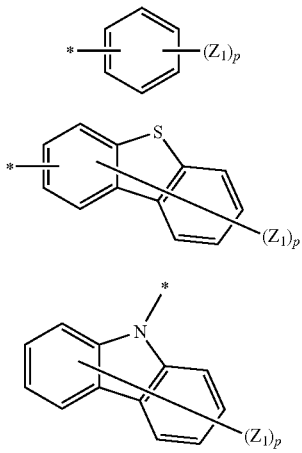

wherein in Formulae 5a to 5c, $Z_1$ is a hydrogen, a deuterium, a substituted or unsubstituted $C_1$ to $C_{20}$ alkyl group, a substituted or unsubstituted $C_6$ to $C_{20}$ aryl group, a substituted or unsubstituted $C_1$ to $C_{20}$ heteroaryl group, a substituted or unsubstituted $C_6$ to $C_{20}$ condensed polycyclic group, a halogen atom, a cyano group, a nitro group, a hydroxy group, or a carboxy group; p is an integer of 1 to 8; and * indicates an attachment position.

In an aspect, $R_4$, $R_5$, $R_8$, and $R_{100}$ in Formula 5 are each independently any one of Formulae 6a to 6c:

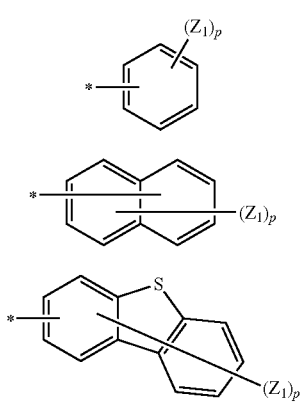

wherein in Formulae 6a to 6c, $Z_1$ is a hydrogen, a deuterium, a substituted or unsubstituted $C_1$ to $C_{20}$ alkyl group, a substituted or unsubstituted $C_6$ to $C_{20}$ aryl group, a substituted or unsubstituted $C_1$ to $C_{20}$ heteroaryl group, a substituted or unsubstituted $C_6$ to $C_{20}$ condensed polycyclic group, a halogen atom, a cyano group, a nitro group, a hydroxy group, or a carboxy group;

p is an integer of 1 to 7; and * indicates an attachment position.

Hereinafter, substituents described with reference to the formulae will now be described in detail. In this regard, the numbers of carbons in substituents are presented only for illustrative purposes and do not limit the characteristics of the substituents. The substituents not defined herein are construed as the same meanings understood by one of ordinary skill in the art.

The term "$C_1$ to $C_{60}$ alkyl group" as used herein refers to a linear or branched saturated hydrocarbon. The $C_1$ to $C_{60}$ alkyl group may be substituted or unsubstituted. Examples of the alkyl group may include, but are not limited to, a methyl group, an ethyl group, a propyl group, an isobutyl group, a sec-butyl group, a pentyl group, an iso-amyl group, a hexyl group, a heptyl group, an octyl group, a nonanyl group, and a dodecyl group. In some embodiments, at least one hydrogen atom of the alkyl group may be substituted with a deuterium atom, a halogen atom, a hydroxyl group, a nitro group, a cyano group, an amino group, an amidino group, a hydrazine, a hydrazone, a carboxyl group or salt thereof, a sulfonic acid or salt thereof, a phosphoric acid or salt thereof, a $C_1$ to $C_{10}$ alkyl group, a $C_1$ to $C_{10}$ alkoxy group, a $C_2$ to $C_{10}$ alkenyl group, a $C_2$ to $C_{10}$ alkynyl group, a $C_6$ to $C_{16}$ aryl group, a $C_4$ to $C_{16}$ heteroaryl group, or an organosilyl group.

The term "$C_2$ to $C_{60}$ alkenyl group" used herein refers to an alkyl group having one or more carbon double bonds. The $C_2$ to $C_{60}$ alkenyl group may be substituted or unsubstituted. Examples of the unsubstituted $C_2$-$C_{60}$ alkenyl group are an ethenyl group, a prophenyl group, and a butenyl group. In some embodiments, at least one hydrogen atom of the unsubstituted alkenyl group may be substituted with the same substituents as described in connection with the substituted alkyl group.

The term "$C_2$ to $C_{60}$ alkynyl group" as used herein refers to an alkyl group having one or more carbon triple bonds. The $C_2$ to $C_{60}$ alkynyl group may be substituted or unsubstituted. Examples thereof are acetylene, propylene, phenylacetylene, naphthylacetylene, isopropylacetylene, t-butylacetylene, and diphenylacetylene. In some embodiments, at least one hydrogen atom of these alkynyl groups may be substituted with the same substituents as described in connection with the substituted alkyl group.

The term "$C_3$ to $C_{60}$ cycloalkyl group" as used herein refers to a $C_3$ to $C_{60}$ cyclic alkyl group. The $C_3$ to $C_{60}$ cycloalkyl group may be substituted or unsubstituted. In some embodiments, at least one hydrogen atom of the cycloalkyl group may be substituted with the same substituents as described in connection with the $C_1$ to $C_{60}$ alkyl group.

The term "$C_1$ to $C_{60}$ alkoxy group" as used herein refers to a group having a structure of —OA wherein A is a $C_1$ to $C_{60}$ alkyl group. The $C_1$ to $C_{60}$ alkoxy group may be substituted or unsubstituted. Non-limiting examples thereof are ethoxy, ethoxy, isopropyloxy, butoxy, and pentoxy. In some embodiments, at least one hydrogen atom of the unsubstituted alkoxy group may be substituted with the same substituents as described in connection with the alkyl group.

The term "$C_6$ to $C_{60}$ aryl group" or "$C_6$-$C_{60}$ arylene group" as used herein refers to a carbocyclic aromatic system having at least one aromatic ring, and when the number of rings is two or more, the rings may be fused to each other or may be linked to each other via, for example, a single bond. The $C_6$ to $C_{60}$ aryl group may be substituted or unsubstituted. In some embodiments, the $C_6$ to $C_{60}$ aryl' may be phenyl, naphthyl, or anthracenyl. In some embodiments, at least one hydrogen atom of the aryl group may be substituted with the same substituents described in connection with the $C_1$ to $C_{60}$ alkyl group.

Examples of a substituted or unsubstituted $C_6$ to $C_{60}$ aryl group are a phenyl group, a $C_1$ to $C_{10}$ alkylphenyl group (for example, an ethylphenyl group), a halophenyl group (for example, o-, m- and p-fluorophenyl groups, and a dichlorophenyl group), a cyanophenyl group, a dicyanophenyl group, a trifluoromethoxyphenyl group, a biphenyl group, a halobiphenyl group, a cyanobiphenyl group, a $C_1$ to $C_{10}$ alkylbiphenyl group, a $C_1$ to $C_{10}$ alkoxybiphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$ to $C_{10}$ an alkylnaphthyl group (for example, a methylnaphthyl group), a $C_1$ to $C_{10}$ alkoxya naphthyl group (for example, a methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthrile group, a triphenylene group, a pyrenyl group, a chrycenyl group, an ethyl-chrycenyl group, a pycenyl group, a perylenyl group, a chloropherylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, and an ovalenyl group.

The term "$C_1$-$C_{60}$ heteroaryl group" as used herein refers to an aromatic ring or ring system including at least one hetero atom selected from nitrogen (N), oxygen (O), phosphorous (P), and sulfur (S), and when the group has two or more rings, the rings may be fused to each other or may be linked to each other via, for example, a single bond. The $C_1$-$C_{60}$ heteroaryl group may be substituted or unsubstituted. Examples of the unsubstituted $C_1$-$C_{60}$ heteroaryl group are a pyrazolyl group, an imidazolyl group, a oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, and a dibenzothiophene group. In some embodiments, at least one hydrogen atom of the heteroaryl may be substituted with the same substituents described in connection with the $C_1$ to $C_{60}$ alkyl group.

The term "$C_6$ to $C_{60}$ aryloxy group" as used herein refers to a group represented by —$OA_1$, wherein $A_1$ is a $C_6$ to $C_{60}$ aryl group. The $C_6$ to $C_{60}$ aryloxy group may be substituted or unsubstituted. An example of the aryloxy group is a phenoxy group. In some embodiments, at least one hydrogen atom of the aryloxy group may be substituted with the same substituents described in connection with the $C_1$ to $C_{60}$ alkyl group.

The term "$C_6$ to $C_{60}$ arylthio group" as used herein refers to a group represented by —$SA_1$, wherein $A_1$ is a $C_6$ to $C_{60}$ aryl group. The $C_6$ to $C_{60}$ arylthio group may be substituted or unsubstituted. Examples of the arylthio group are a benzenethio group and a naphthylthio group. In some embodiments, at least one hydrogen atom of the arylthio group may be substituted with the same substituents described in connection with the $C_1$ to $C_{60}$ alkyl group.

The term "$C_6$ to $C_{60}$ condensed polycyclic group" as used herein refers to a substituent having two or more rings formed by fusing at least one aromatic ring and at least one non-aromatic ring or in which a unsaturated group is present in a ring but a fully conjugated system does not exist, and the condensed polycyclic group overall does not have a fully delocalized system of pi electrons including each atom of the ring system, which is in contrast to the aryl group or the heteroaryl group.

Non-limiting examples of compounds represented by Formula 1 are compounds illustrated below:

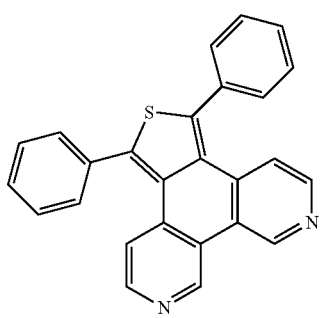

S-1

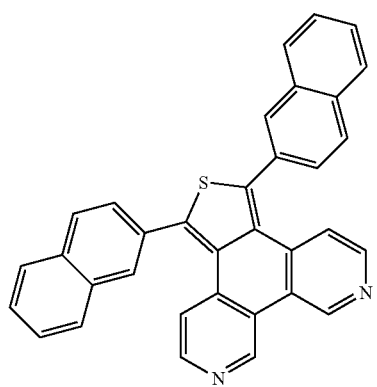

S-2

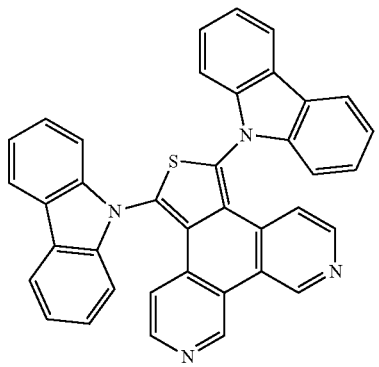

S-3

-continued
S-4
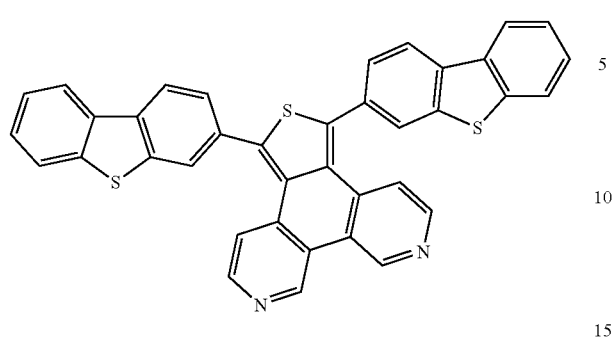
S-5
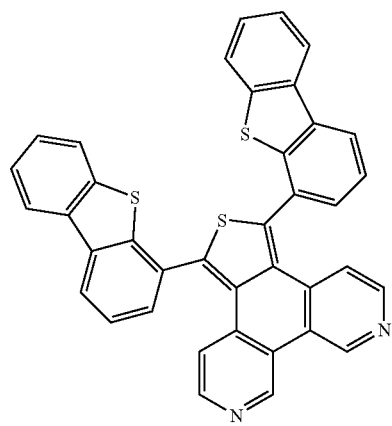
S-6
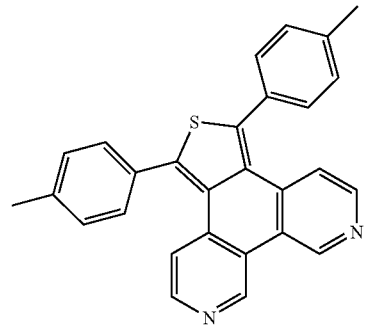
S-7
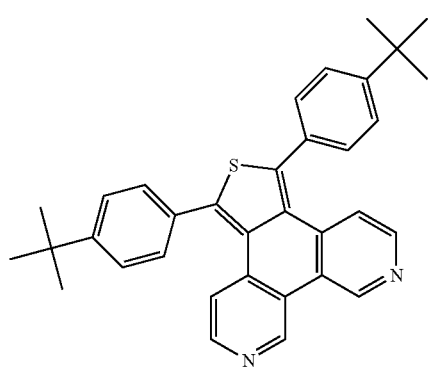
S-8
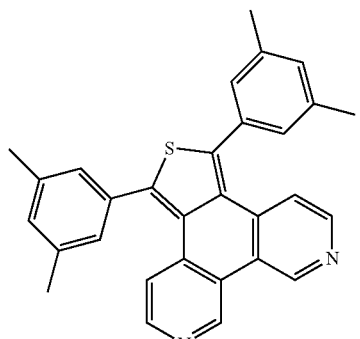
S-9
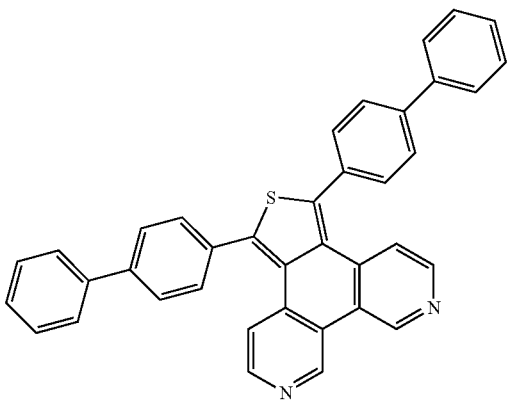
S-10
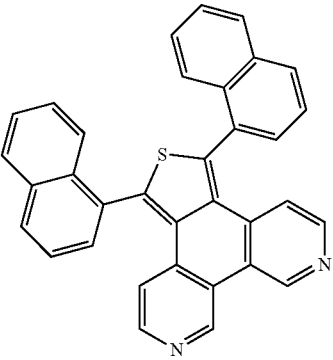
S-11
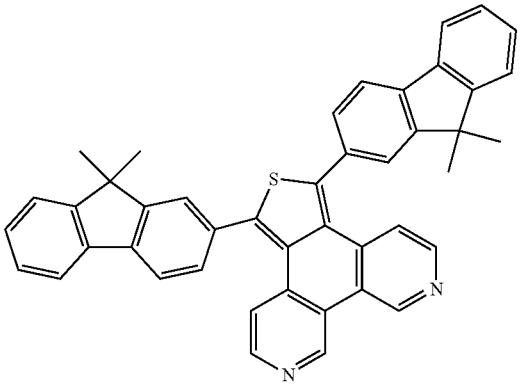

-continued
S-12
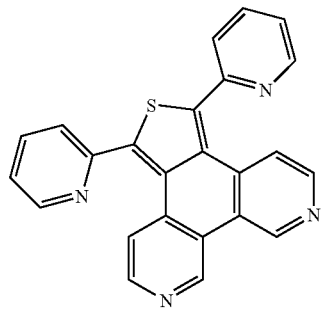
S-13
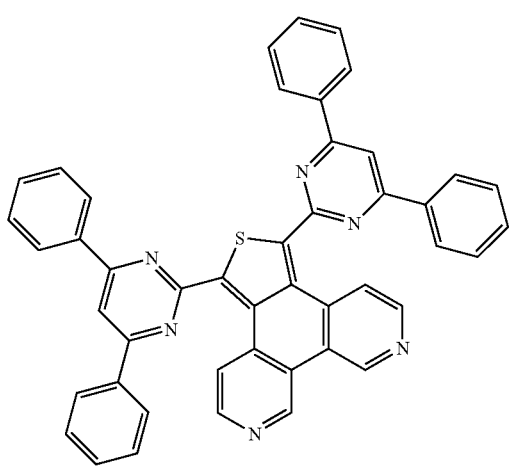
S-14
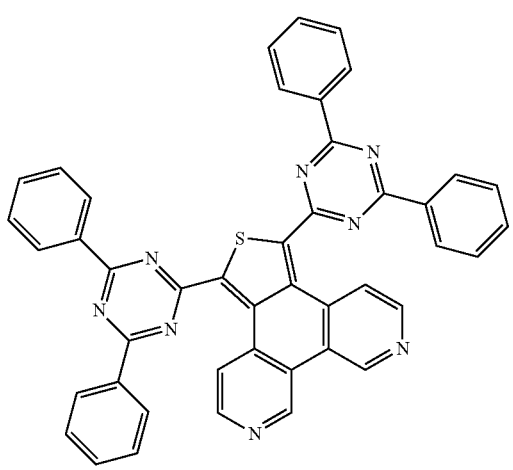
S-15
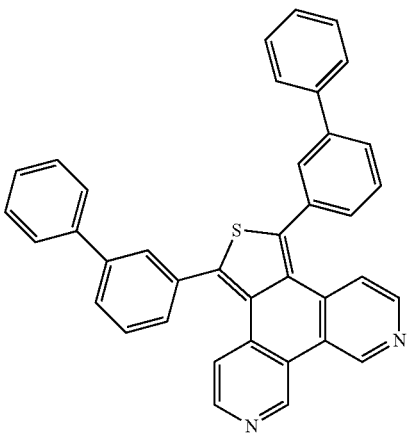
S-16
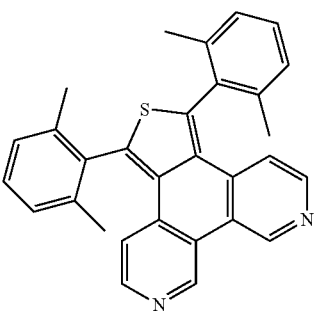
S-17
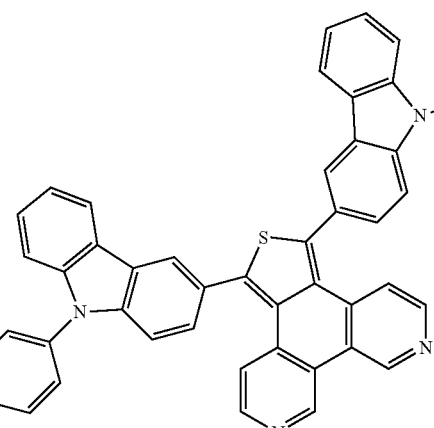
S-18
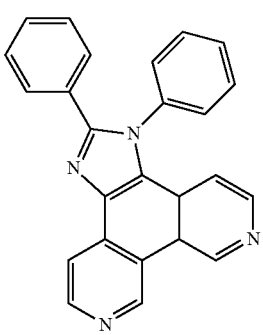

-continued
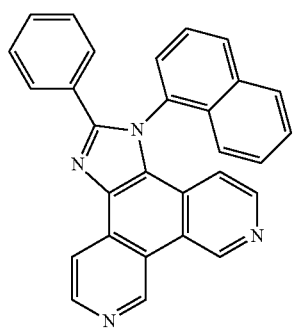
S-19
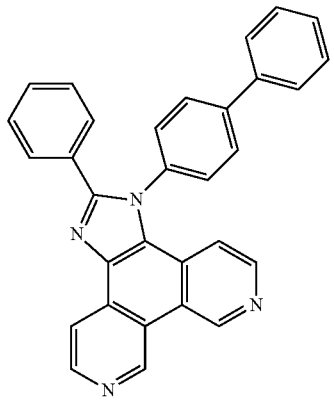
S-23
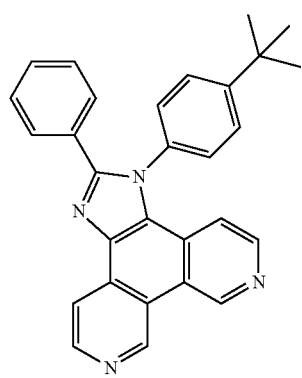
S-20
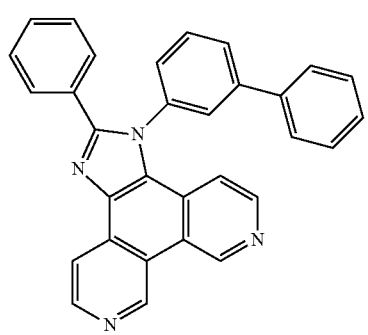
S-24
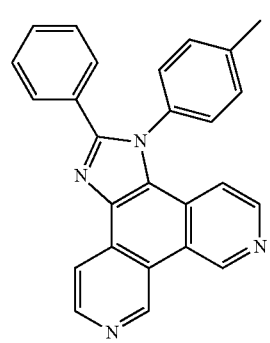
S-21
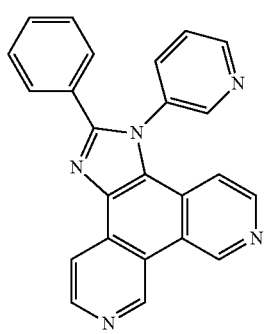
S-25
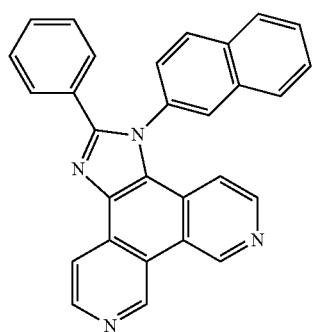
S-22
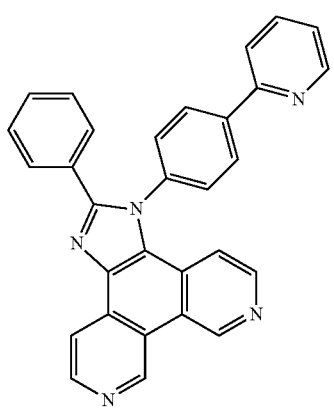
S-26

S-27
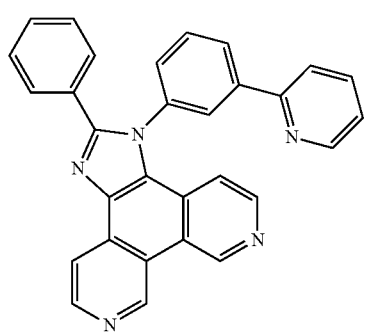
S-28
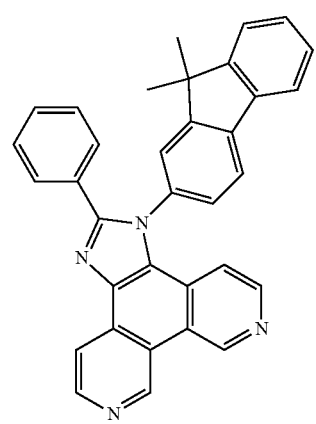
S-29
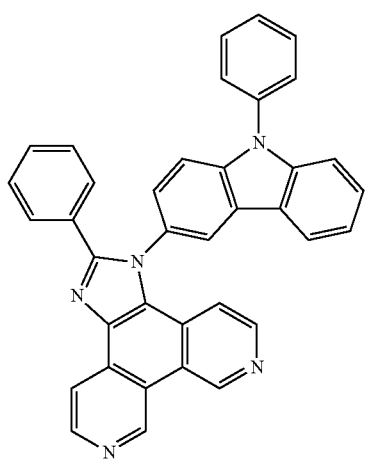
S-30
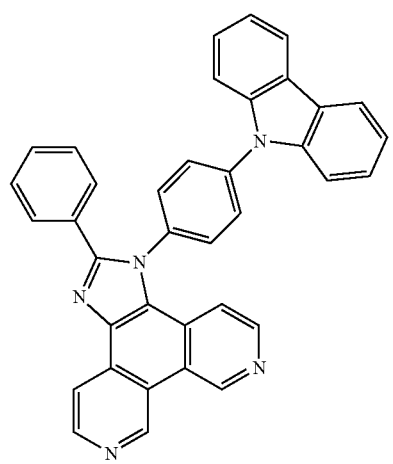
S-31
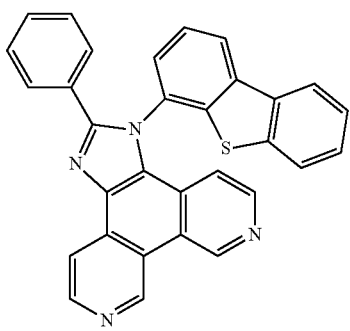
S-32
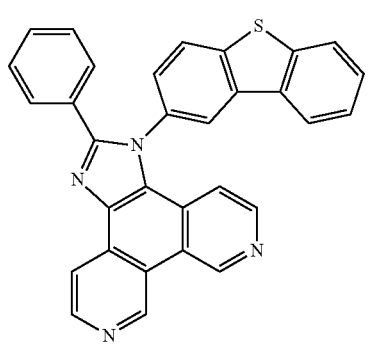
S-33
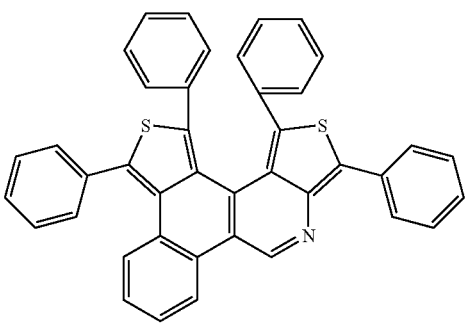
S-34
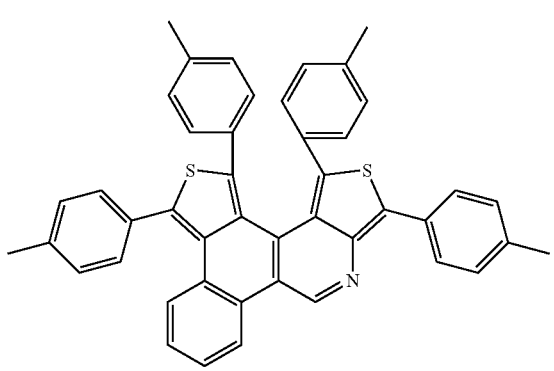

S-35
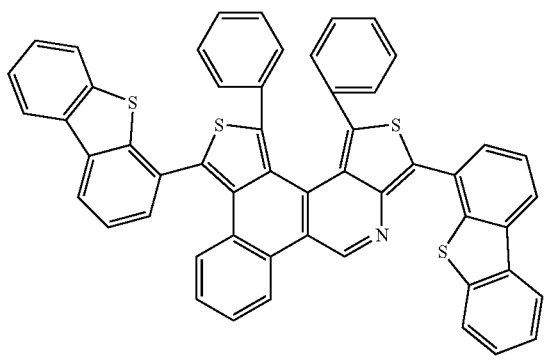

S-36
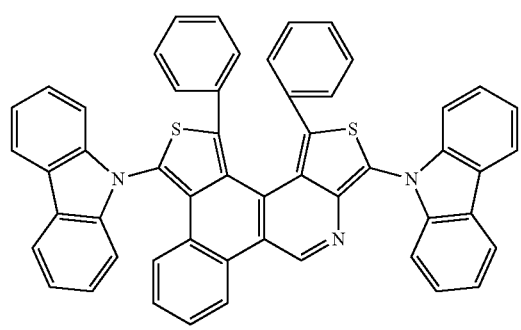

S-37
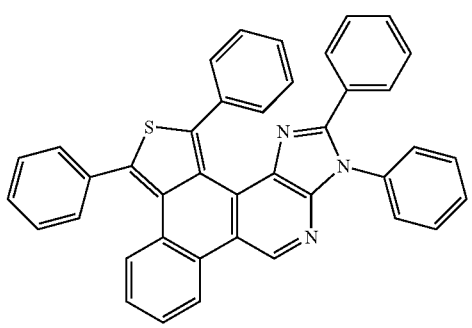

S-38
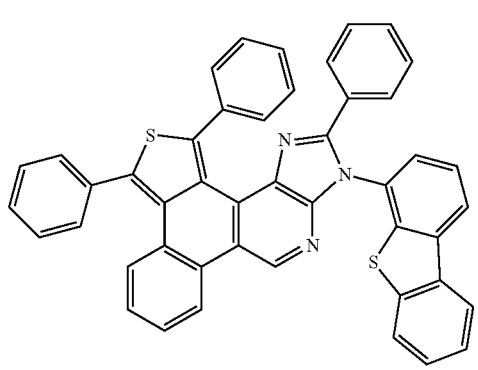

S-39
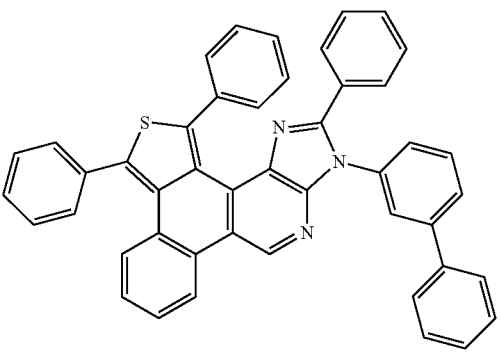

S-40
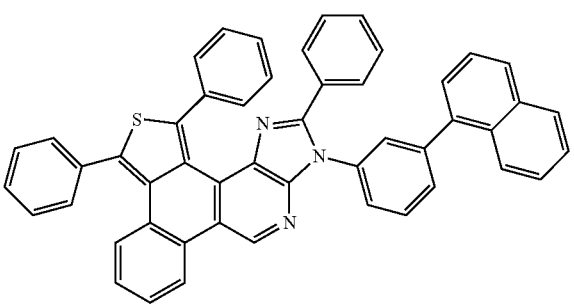

S-41
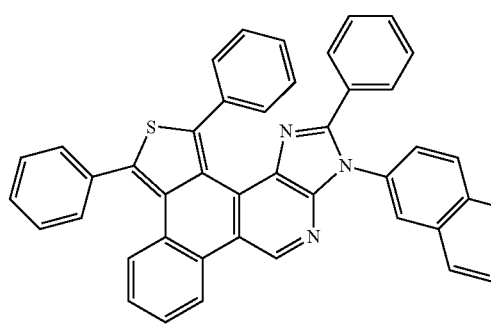

S-42
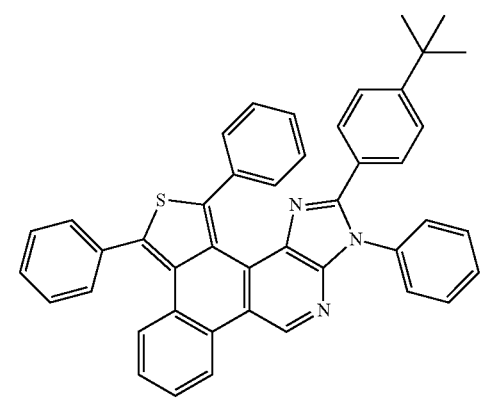

An organic light-emitting device according to an embodiment includes a first electrode, a second electrode, and an organic layer disposed between the first electrode and the second electrode, wherein the organic layer includes the compound represented by any one of Formula 1 above.

In some embodiments, the organic layer may include at least one layer selected from a hole injection layer, a hole transport layer, a functional layer having a hole injection function and a hole transport function (hereinafter referred to as "H-functional layer"), a buffer layer, an electron blocking layer, an emission layer, a hole blocking layer, an electron transport layer, an electron injection layer, and a functional layer having an electron transport function and an electron injection function (hereinafter referred to as "E-functional layer").

In some embodiments, the organic layer may be a luminescent layer, and may be, for example, a green phosphorescent or a red phosphorescent luminescent layer.

According to an embodiment, the organic light-emitting device may include an electron injection layer, an electron transport layer, an emission layer, a hole injection layer, a hole transport layer, or a H-functional layer, and the emission layer may include an anthracene-based compound, an arylamine-based compound, or a styryl-based compound.

According to another embodiment, the organic light-emitting device may include an electron injection layer, an electron transport layer, an emission layer, a hole injection layer, a hole transport layer, or a H-functional layer, and the emission layer may includes a red layer, a green layer, a blue layer, and a white layer, and any one of these layers may include a phosphorescent compound, and the hole injection layer, the hole transport layer, or the H-functional layer may include a charge-generation material. Also, the charge-generation material may be a p-dopant, and the p-dopant may be a quinone derivative, a metal oxide, or a cyano group-containing compound.

According to another embodiment, the organic layer may include an electron transport layer that includes a metal complex. The metal complex may be a Li complex.

The term "organic layer" as used herein refers to a single layer and/or a plurality of layers disposed between the first electrode and the second electrode of an organic light-emitting device.

FIG. 1 is a schematic cross-sectional view of an organic light-emitting device according to an embodiment. Hereinafter, the structure of an organic light-emitting device according to an embodiment and a method of manufacturing an organic light-emitting device according to an embodiment will be described in connection with FIG. 1.

A substrate (not shown) may be any one of various substrates that are used in a known organic light-emitting device, and may be a glass substrate or a transparent plastic substrate, with excellent mechanical strength, thermal stability, transparency, surface smoothness, ease of handling, and water repellency.

The first electrode may be formed by, for example, depositing or sputtering a material for a first electrode on the substrate. When the first electrode is an anode, the material for the first electrode may be selected from materials with a high work function to make holes be easily injected. The first electrode may be a reflective electrode or a transmission electrode. In some embodiments, the material for the first electrode may be a transparent and highly conductive material, and examples of such a material are indium tin oxide (ITO), indium zinc oxide (IZO), tin oxide ($SnO_2$), and zinc oxide (ZnO). In some embodiments, magnesium (Mg), aluminum (Al), aluminum-lithium (Al—Li), calcium (Ca), magnesium-indium (Mg—In), or magnesium-silver (Mg—Ag) may be used to form the first electrode as a reflective electrode.

In some embodiments, the first electrode may be a single- or multi-layered structure. For example, the first electrode may have a three-layered structure of ITO/Ag/ITO, but the structure of the first electrode is not limited thereto.

In some embodiments, an organic layer is disposed on the first electrode.

In some embodiments, the organic layer may include a hole injection layer, a hole transport layer, a buffer layer (not shown), an emission layer, an electron transport layer, or an electron injection layer.

In some embodiments, a hole injection layer (HIL) may be formed on the first electrode by using various methods, such as vacuum deposition, spin coating, casting, langmuir-blodgett (LB) deposition, or the like.

When the hole injection layer is formed using vacuum deposition, vacuum deposition conditions may vary according to the compound that is used to form the hole injection layer, and the desired structure and thermal properties of the hole injection layer to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the hole injection layer is formed using spin coating, the coating conditions may vary according to the compound that is used to form the hole injection layer, and the desired structure and thermal properties of the hole injection layer to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

For use as a hole injection material, any known hole injection material may be used, and examples of any known hole injection material are N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenylbenzidine (NPB), TDATA, 2-TNATA, a polyaniline/dodecylbenzenesulfonic acid (pani/DBSA), poly(3,4-ethylenedioxythiophene)/poly(4-styrenesulfonate) (PEDOT/PSS), polyaniline/camphor sulfonicacid (pani/CSA), and (polyaniline)/poly(4-styrenesulfonate) (PANI/PSS), but they are not limited thereto.

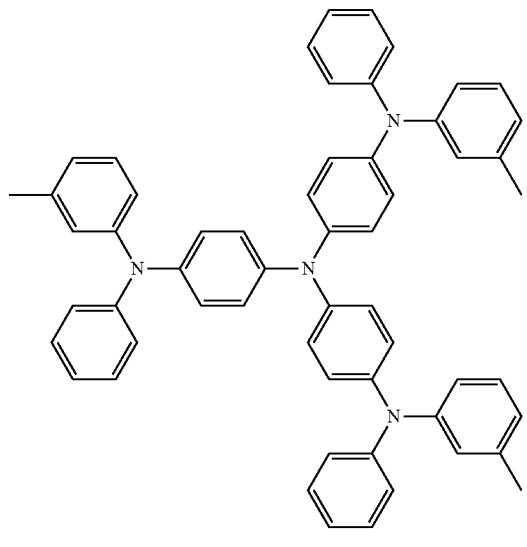

m-MTDATA

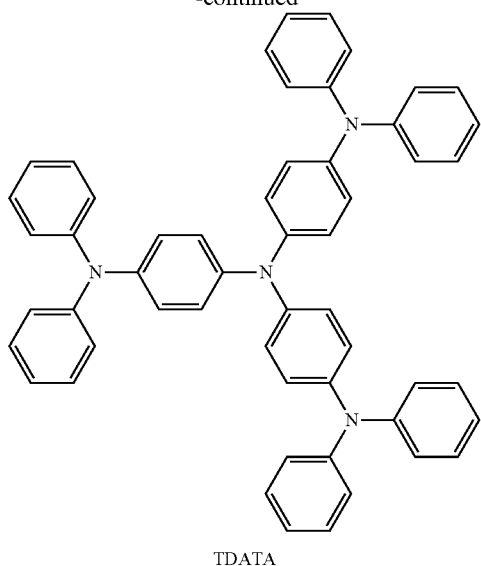

TDATA

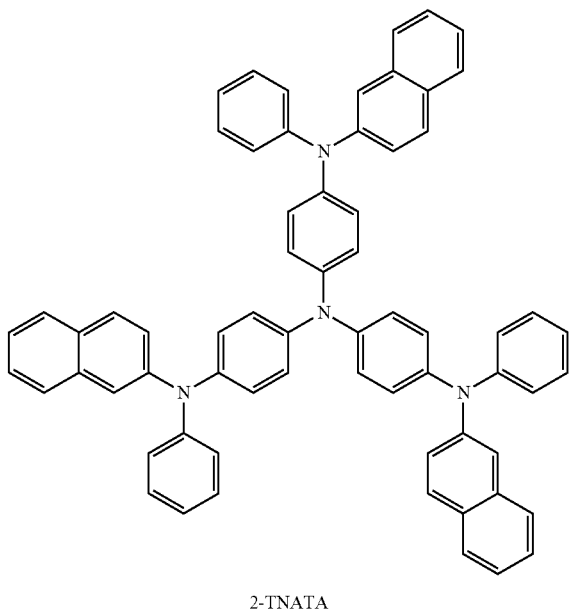

2-TNATA

In some embodiments, a thickness of the hole injection layer may be in a range of about 100 Å to about 10,000 Å, for example, about 100 Å to about 1,000 Å. If the thickness of the hole injection layer is within the ranges described above, excellent electron injection characteristics may be obtained without a substantial increase in driving voltage.

Then, a hole transport layer (HTL) may be formed on the hole injection layer by using vacuum deposition, spin coating, casting, or LB. When the hole transport layer is formed by vacuum deposition or spin coating, the deposition or coating conditions may be similar to those applied to form the hole injection layer although the deposition or coating conditions may vary according to the material that is used to form the hole transport layer.

For use as a hole transport material, any known hole transport material may be used. Examples of a known hole transport material are a carbazole derivative, such as N-phenylcarbazole or polyvinylcarbazol, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB), but are not limited thereto.

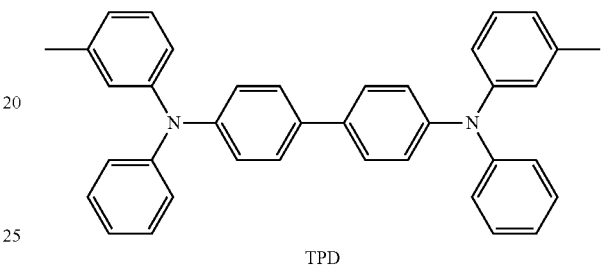

TPD

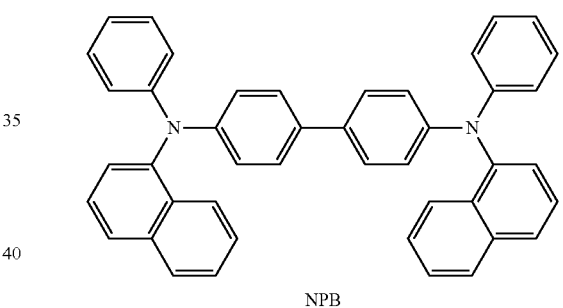

NPB

In some embodiments, a thickness of the hole transport layer may be in a range of about 50 Å to about 2,000 Å, for example, about 100 Å to about 1,500 Å. When the thickness of the hole transport layer is within these ranges, the hole transport layer may have satisfactory hole transporting ability without a substantial increase in driving voltage.

In some embodiments, the H-functional layer may include at least one material selected from the materials used to form a hole injection layer and the materials used to form a hole transport layer, and a thickness of the H-functional layer may be in a range of about 100 Å to about 10000 Å, for example, about 100 Å to about 1000 Å. When the thickness of the H-functional layer is within these ranges, satisfactory hole injection and transport characteristics may be obtained without a substantial increase in driving voltage.

In some embodiments, at least one layer of the hole injection layer, the hole transport layer, and the H-functional layer may include at least one of a compound represented by Formula 300 and a compound represented by Formula 350:

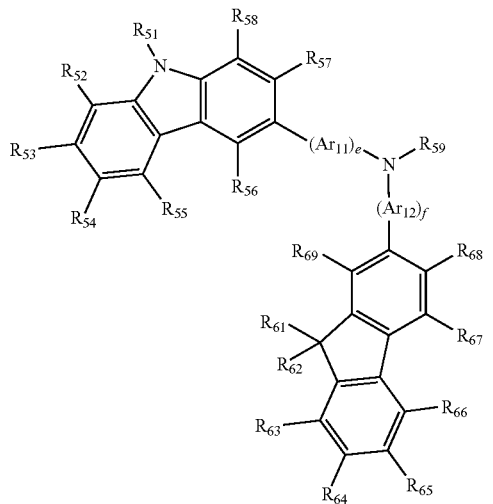

Formula 300

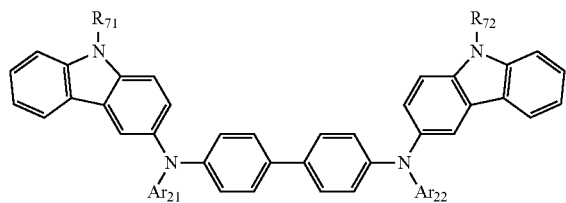

Formula 350 wherein in Formulae 300 and 350, $Ar_{11}$, $Ar_{12}$, $Ar_{21}$, and $Ar_{22}$ are each independently, a substituted or unsubstituted $C_6$-$C_{60}$ arylene group.

e and f in Formula 300 may be each independently an integer of 0 to 5, or 0, 1 or 2. For example, e may be 1 and f may be 0, but are not limited thereto.

$R_{51}$ to $R_{58}$, $R_{61}$ to $R_{69}$ and $R_{71}$ and $R_{72}$ in Formulae 300 and 350 may be each independently a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or substituted or unsubstituted $C_6$-$C_{60}$ arylthio group. For example, $R_{51}$ to $R_{58}$, $R_{61}$ to $R_{69}$, and $R_{71}$ and $R_{72}$ may be each independently selected from a hydrogen; a deuterium; a halogen atom; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a C1-C10 alkyl group (for example, a methyl group, an ethyl group, a propyl group, a butyl group, a pentyl group, or a hexyl group); a $C_1$-$C_{10}$ alkoxy group (for example, a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof and a phosphoric acid group or a salt thereof;

a phenyl group; a naphthyl group; anthryl group; a fluorenyl group; a pyrenyl group; and a phenyl group, a naphthyl group, anthryl group, a fluorenyl group and a pyrenyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group.

$R_{59}$ in Formula 300 may be one selected from a phenyl group; a naphthyl group; anthryl group; a biphenyl group; a pyridyl group; and a phenyl group, a naphthyl group, anthryl group, a biphenyl group and a pyridyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In some embodiments, the compound represented by Formula 300 may be represented by Formula 300A, but is not limited thereto:

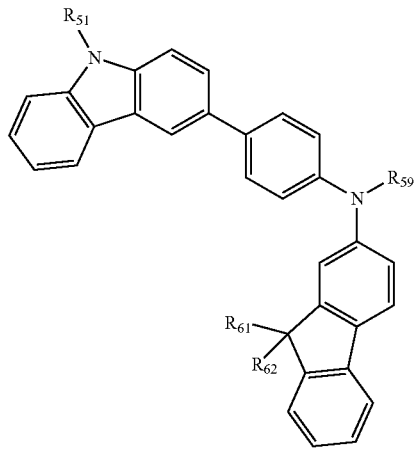

Formula 300A where $R_{51}$, $R_{60}$, $R_{61}$, and $R_{59}$ in Formula 300A are defined as described for Formula 300.

For example, at least one layer of the hole injection layer, the hole transport layer, and the H-functional layer may include at least one of Compounds 301 to 320 below, but may instead include other materials.

-continued
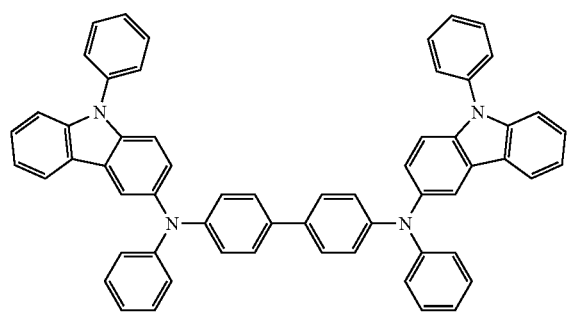
301
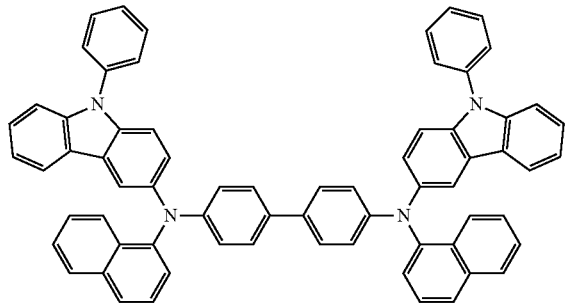
305
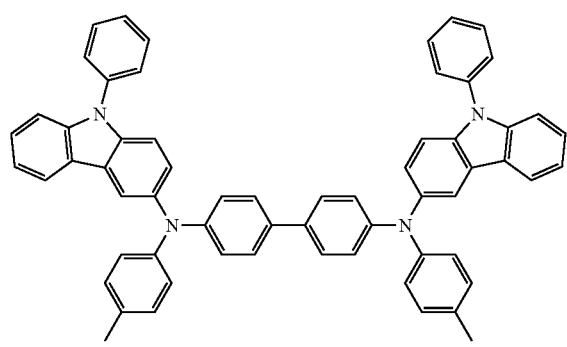
302
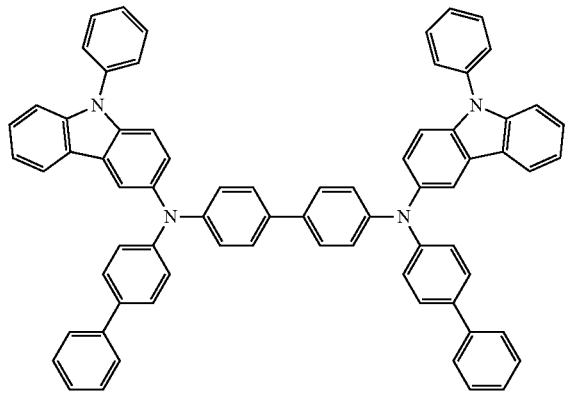
306
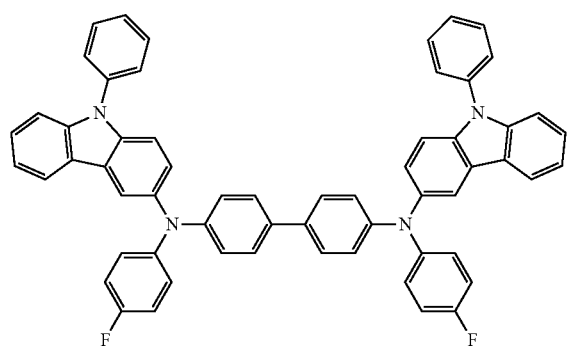
303
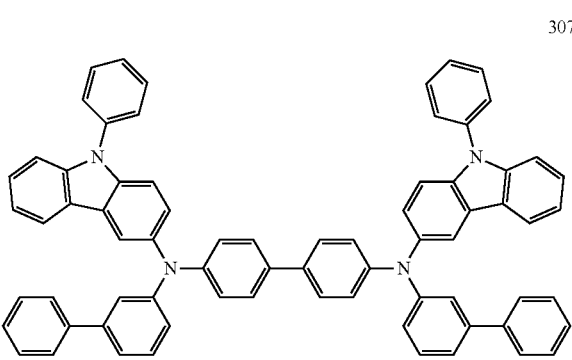
307
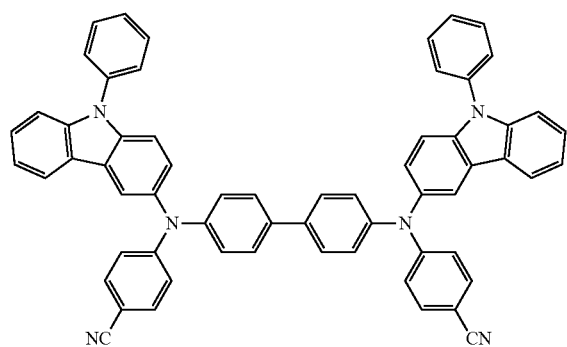
304
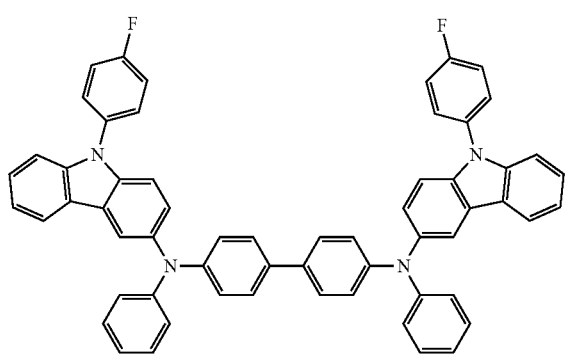
308

309
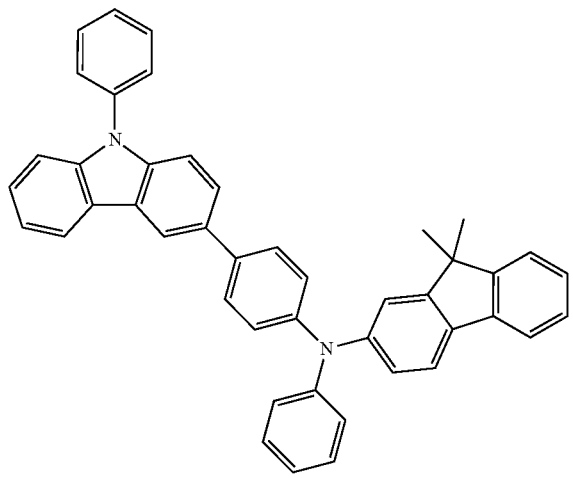
310
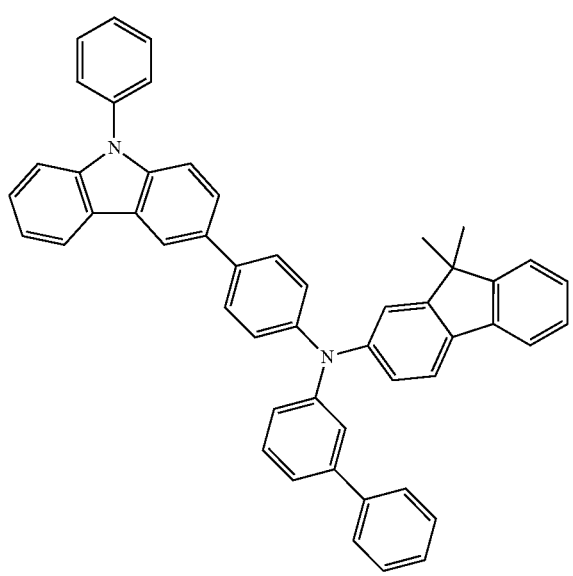
311
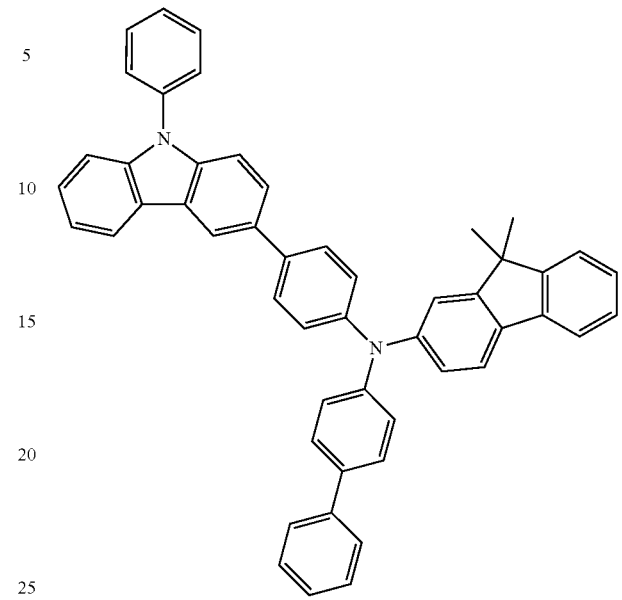
312
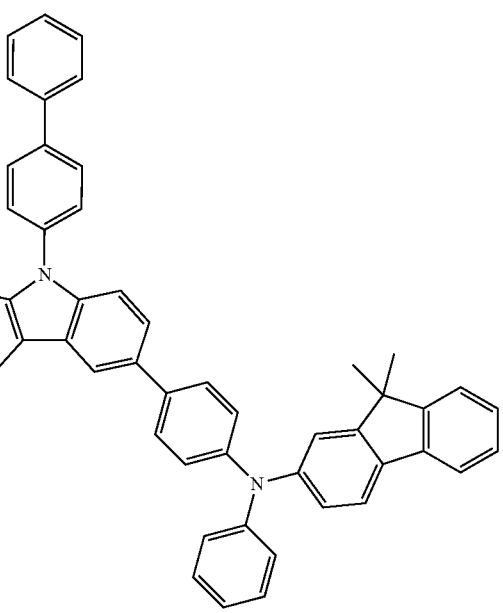

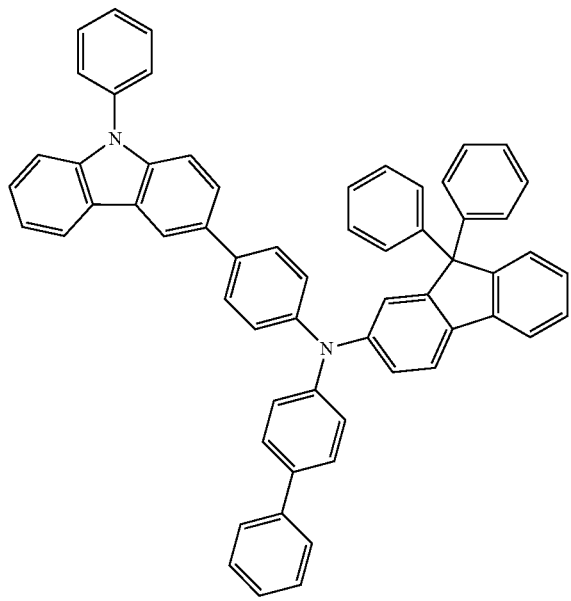
313
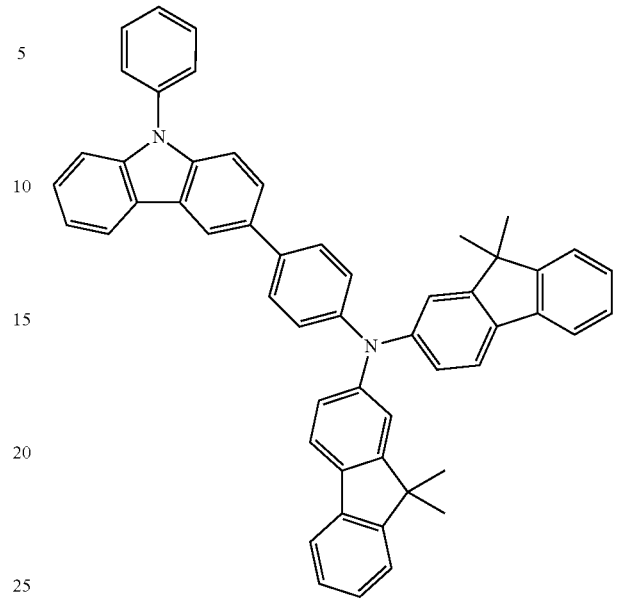
315
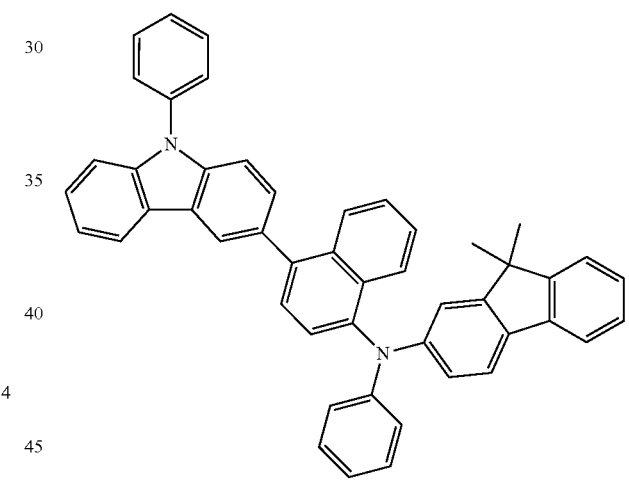
316
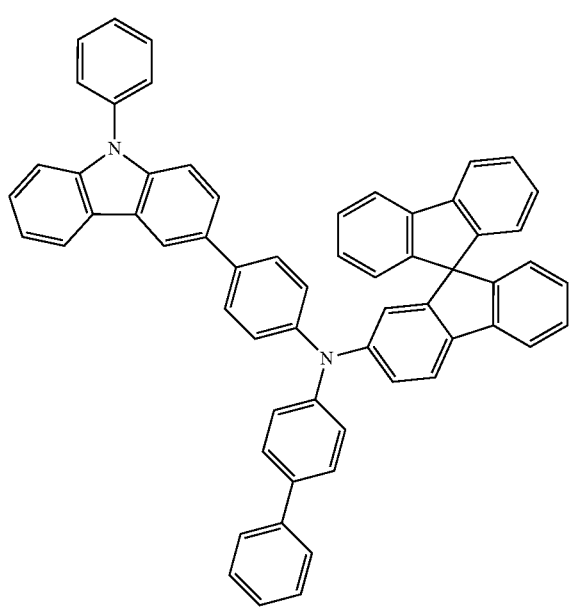
314
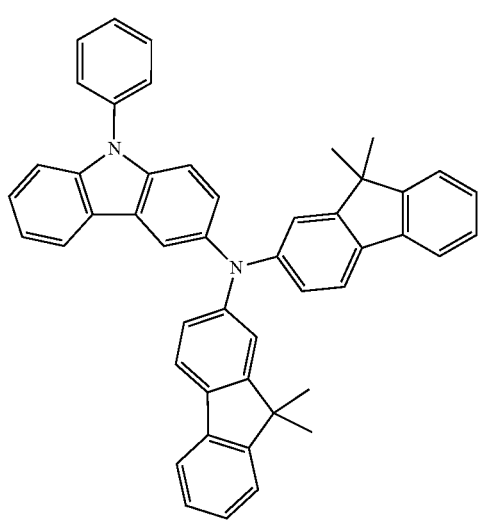
317

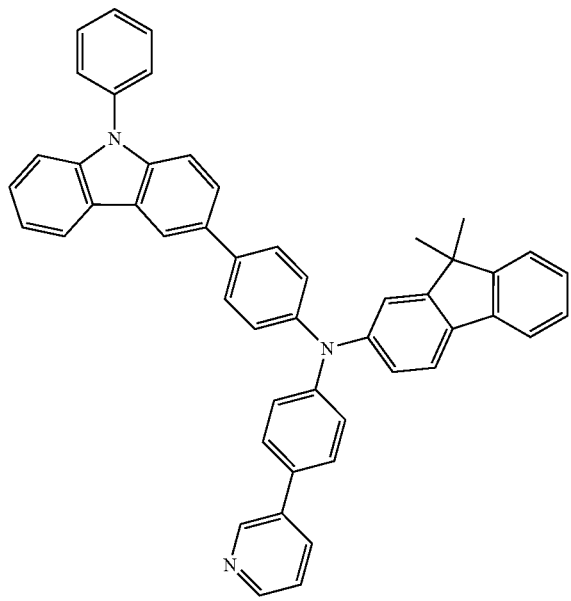

318

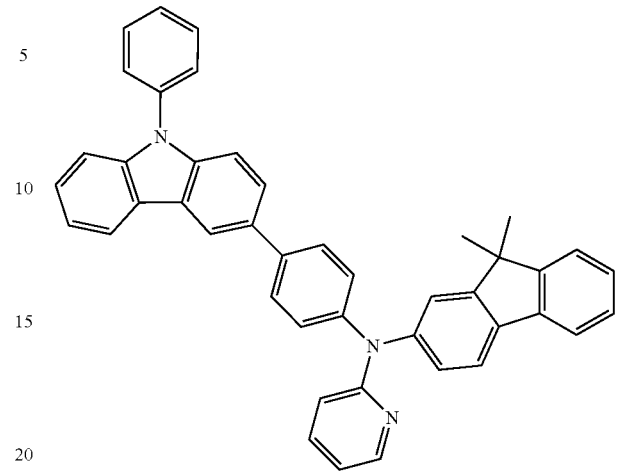

320

In some embodiments, at least one of the hole injection layer, the hole transport layer, and the H-functional layer may further include a charge-generating material to increase conductivity of a layer, in addition to such known hole injection materials, known hole transport materials, and/or known materials having both hole injection and hole transport capabilities.

In some embodiments, the charge-generation material may be, for example, a p-dopant. In some embodiments, the p-dopant may be one of a quinone derivative, a metal oxide, and a cyano group-containing compound, but is not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as tungsten oxide or molybdenium oxide; and a cyano group-containing compound, such as Compound 200 below, but are not limited thereto.

319

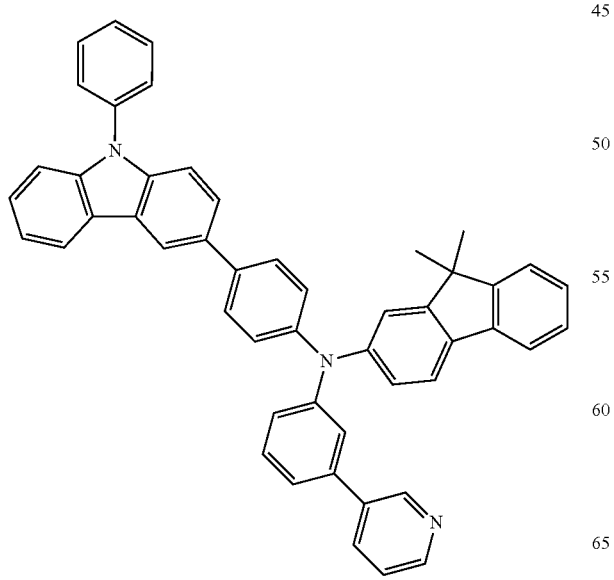

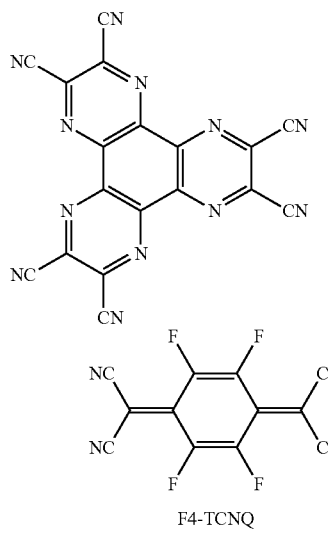

Compound 200

F4-TCNQ

When the hole injection layer, the hole transport layer or the H-functional layer further includes a charge-generation material, the charge-generation material may be homogeneously dispersed or non-homogeneously distributed in the hole injection layer, the hole transport layer, and the H-functional layer.

In some embodiments, a buffer layer may be disposed between at least one of the hole injection layer, the hole transport layer, and the H-functional layer, and an emission layer. Also, the buffer layer may compensate for an optical resonance distance according to a wavelength of light emitted from the emission layer, and thus, efficiency of a formed organic light-emitting device may be improved. The buffer layer may include a known hole injection material and a hole transport material. Also, the buffer layer may include a material that is identical to one of materials included in the hole injection layer, the hole transport layer, and the H-functional layer formed under the buffer layer.

Subsequently, an emission layer (EML) may be formed on the hole transport layer, the H-functional layer, or the buffer layer by spin coating, casting, or a LB method. When the emission layer is formed by vacuum deposition or spin coating, the deposition and coating conditions may be similar to those for the formation of the hole injection layer, though the conditions for deposition and coating may vary according to the material that is used to form the emission layer.

In some embodiments, the emission layer may be formed by using a compound as disclosed and described herein or known luminescent materials. For example, the emission layer may be formed by using a host and a dopant. An example of the dopant may be any known fluorescent or phosphorescent dopant.

Examples of known host are Alg$_3$, 4,4'-N,N'-dicarbazole-biphenyl (CBP), poly(n-vinylcarbazole)(PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, distyrylarylene (DSA), dmCBP (see the following chemical structure), and Compounds 501 to 509 illustrated below, but are not limited thereto.

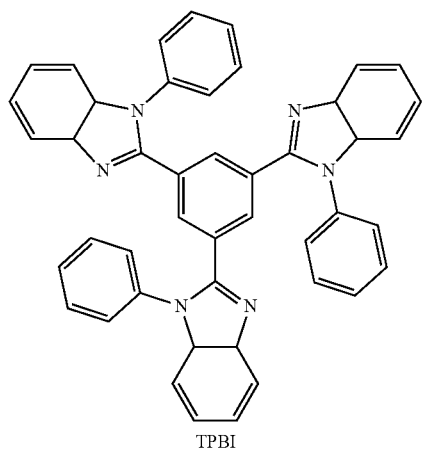

TPBI

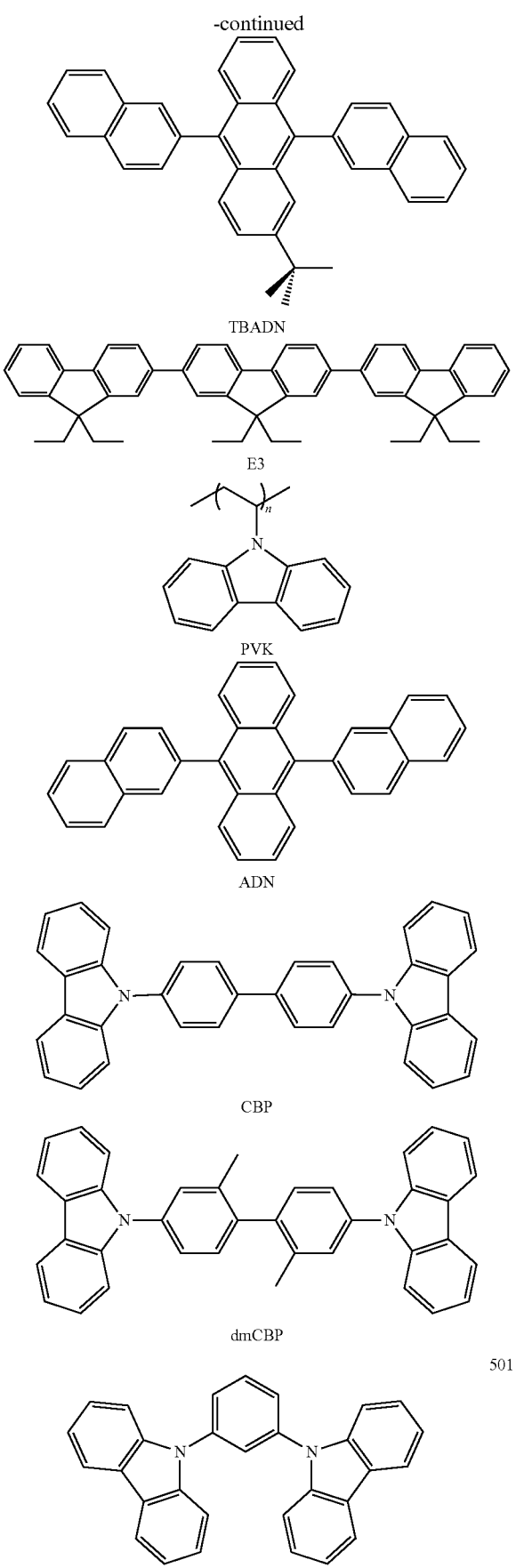

TBADN

E3

PVK

ADN

CBP dmCBP

501

502 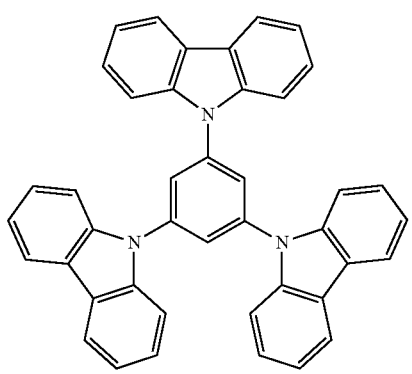
503 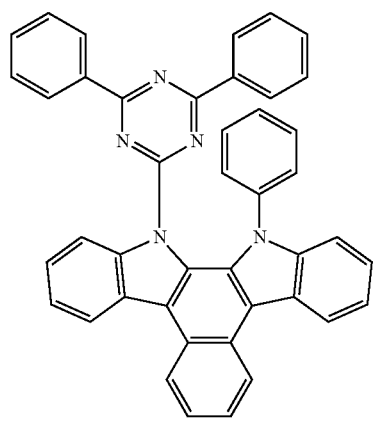
504 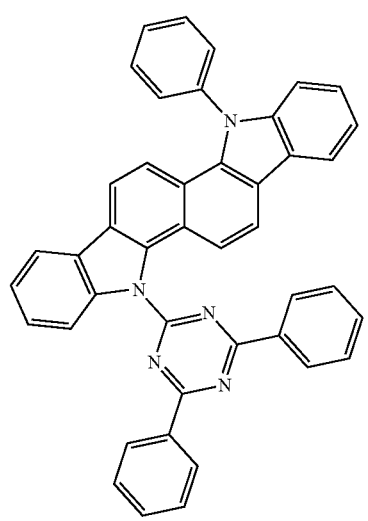
505 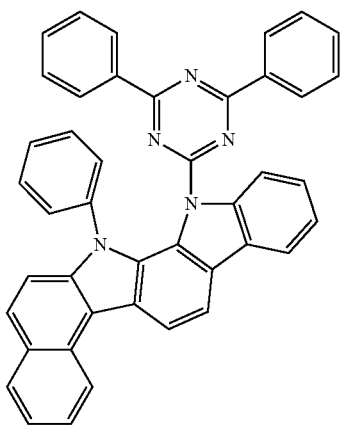
506 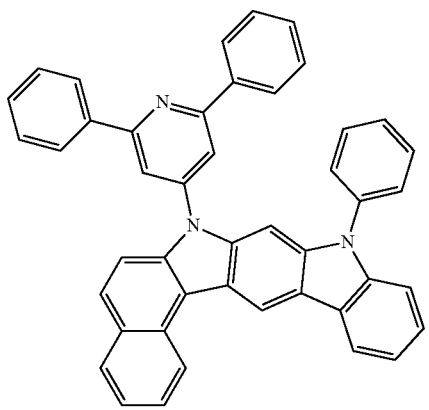
507 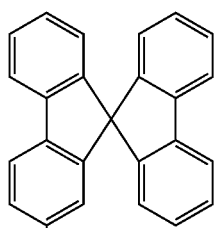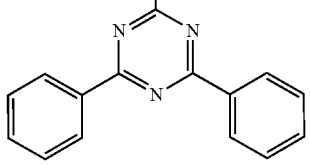
508 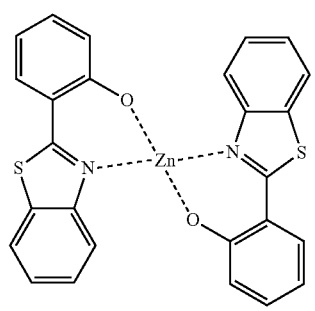

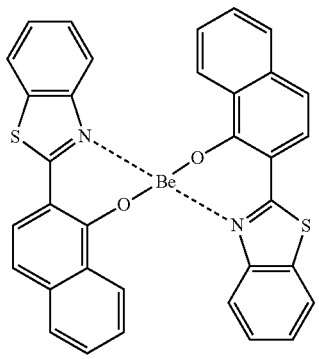

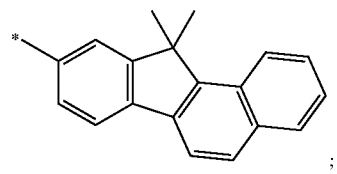 [SMILES: Cc1ccc2c(c1)C(C)(C)c1c-2ccc2ccccc12]

but are not limited thereto.

For example, the anthracene-based compound represented by Formula 400 may be one of the following compounds, but is not limited thereto:

An example of the host may be an anthracene-based compound represented by Formula 400:

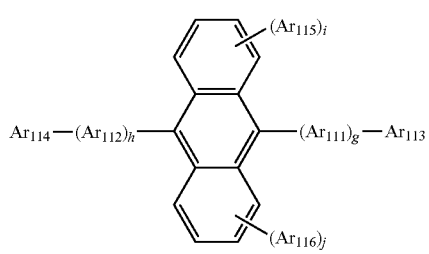

Formula 400> wherein, in Formula 400, $Ar_{111}$ and $Ar_{112}$ may be each independently a substituted or unsubstituted $C_6$-$C_{60}$ arylene group; $Ar_{113}$ to $Ar_{116}$ may be each independently a substituted or unsubstituted $C_1$-$C_{10}$ alkyl group, or a substituted or unsubstituted $C_6$-$C_{60}$ aryl group; and g, h, i, and j are each independently an integer of 0 to 4.

For example, $Ar_{111}$ and $Ar_{112}$ in Formula 400 may be each independently a phenylene group, a naphthylene group, a phenanthrenyl group, or a pyrenylene group; or a phenylene group, a naphthylene group, a phenanthrenyl group, a fluorenyl group, or a pyrenylene group, each substituted with at least one of a phenyl group, a naphthyl group, and an anthryl group, but are not limited thereto.

In some embodiments, g, h, i, and j in Formula 400 may each be independently 0, 1, or 2.

$Ar_{113}$ to $Ar_{116}$ in Formula 400 may be each independently a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; or a phenyl group, a naphthyl group, an anthryl group, a pyrenyl group, a phenanthrenyl group, and a fluorenyl group, each substituted with at least one of a deuterium atom, a halogen atom, a hydroxyl group, a cyano group, a nitro group, an amino group, an amidino group, a hydrazine, a hydrazone, a carboxyl group or salt thereof, a sulfonic group or salt thereof, a phosphoric acid group or salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, pyrenyl group, a phenanthrenyl group, a fluorenyl group, and

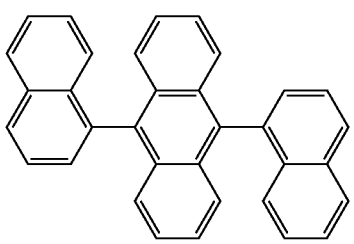

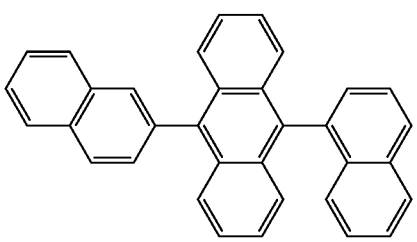

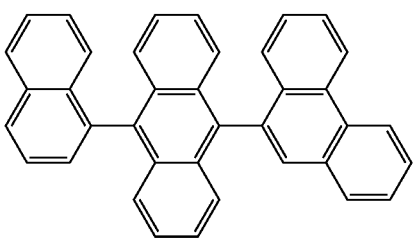

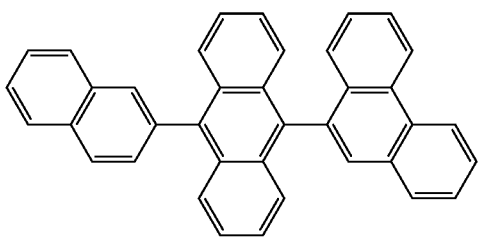

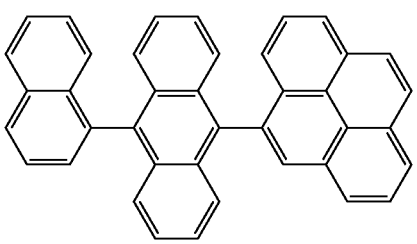

-continued

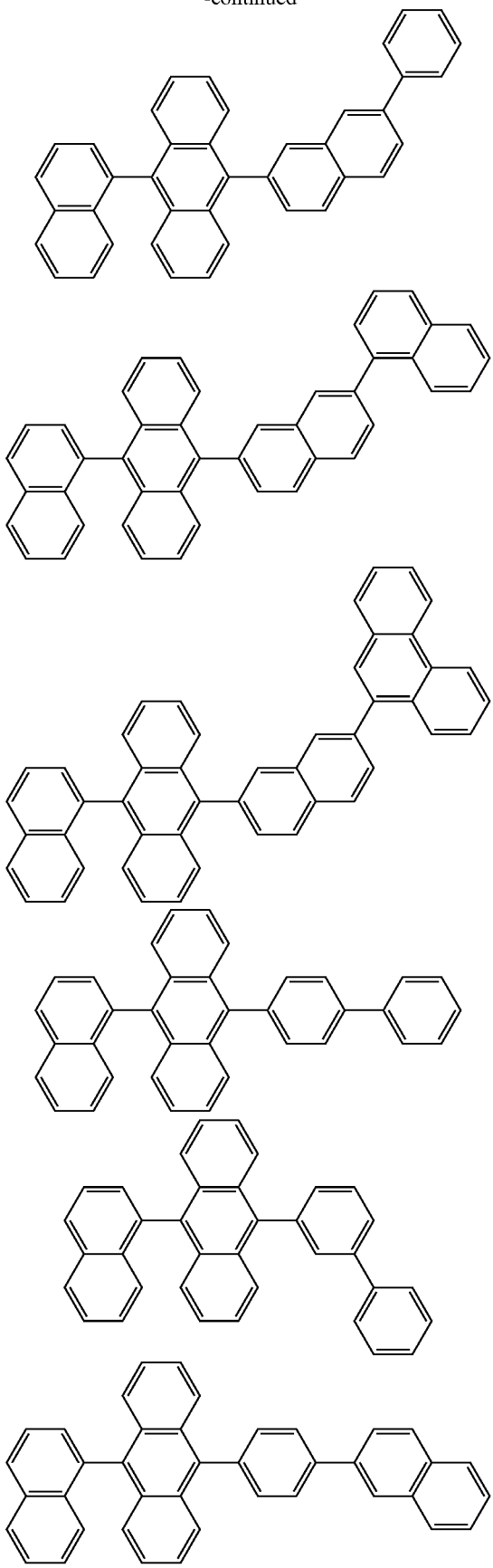

47
-continued
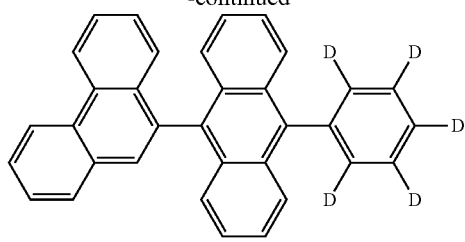
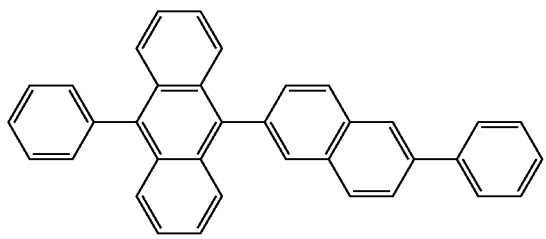
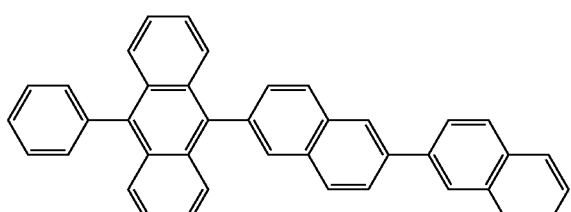
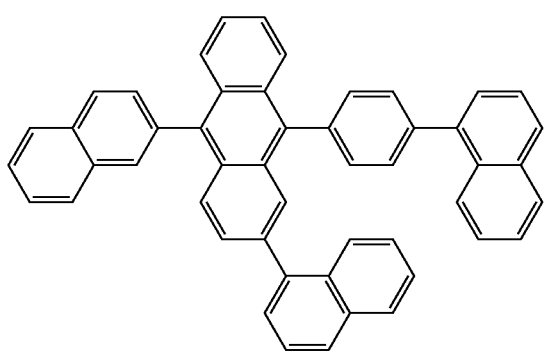
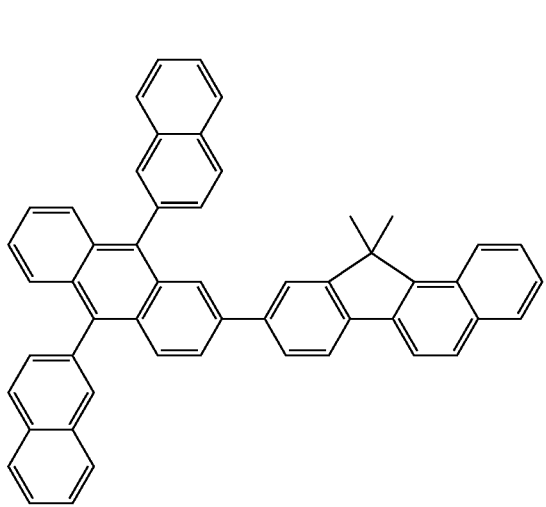
48
-continued
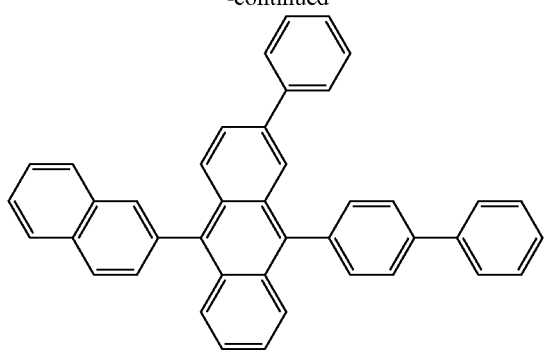
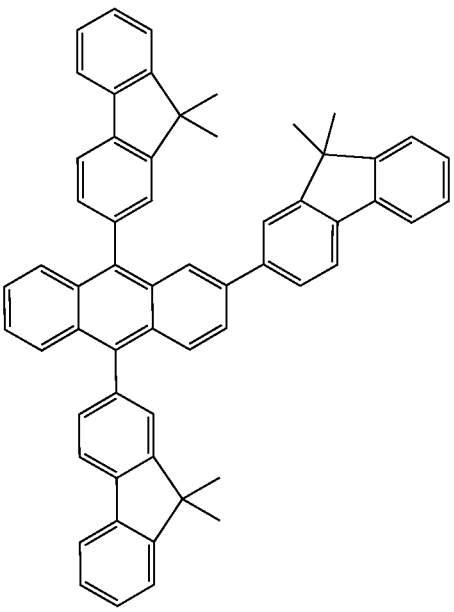
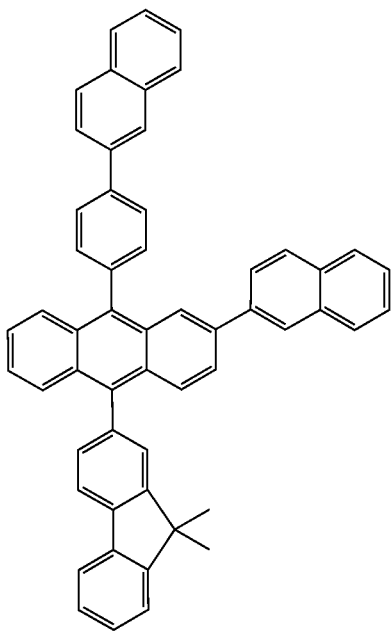

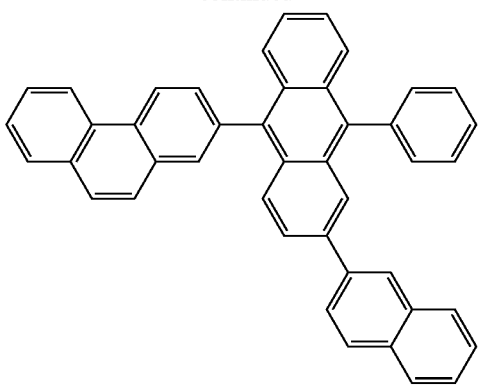

In some embodiments, the host may be an anthracene-based compound represented by Formula 401 below:

Formula 401

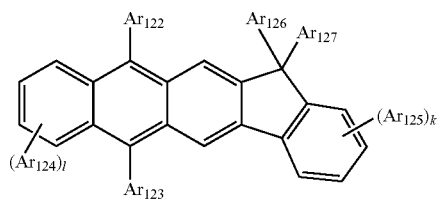

$Ar_{122}$ to $Ar_{125}$ in Formula 401 are the same as described in detail in connection with $Ar_{113}$ in Formula 400.

$Ar_{126}$ and $Ar_{127}$ in Formula 401 may be each independently a $C_1$-$C_{10}$ alkyl group (for example, a methyl group, an ethyl group, or a propyl group).

k and l in Formula 401 may be each independently an integer of 0 to 4. For example, k and l may be 0, 1, or 2.

For example, the anthracene-based compound represented by Formula 401 may be one of the following compounds, but is not limited thereto:

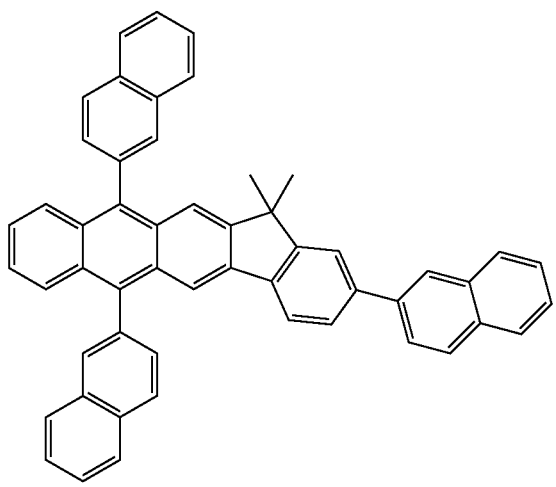

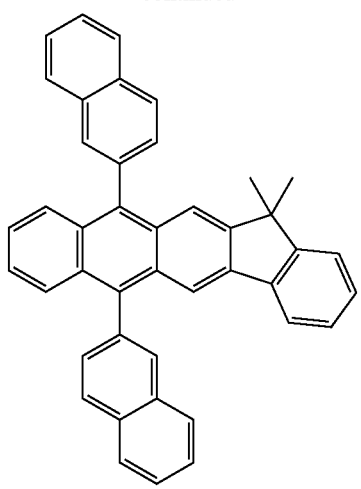

When the organic light-emitting device is a full color organic light-emitting device, the emission layer may be patterned into a red emission layer, a green emission layer, and a blue emission layer.

Also, at least one of the red emission layer, the green emission layer, and the blue emission layer may include the following dopants (ppy=phenylpyridine)

For example, compounds illustrated below may be used as a blue dopant, but the blue dopant is not limited thereto.

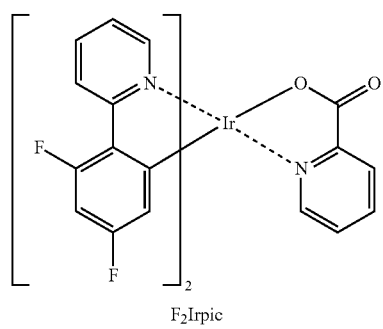
F2Irpic
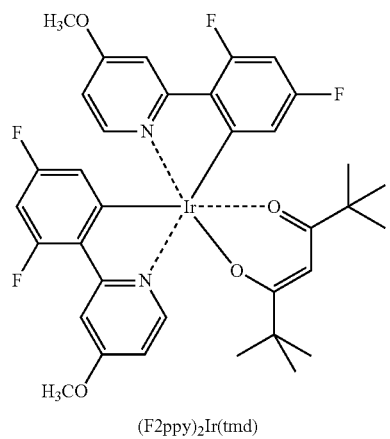
(F2ppy)2Ir(tmd)
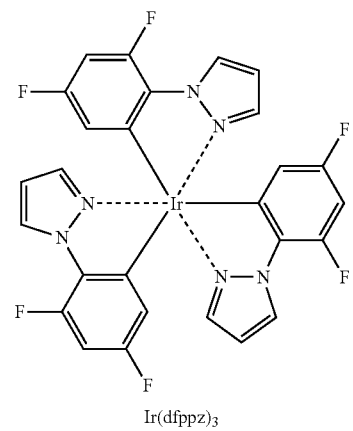
Ir(dfppz)3
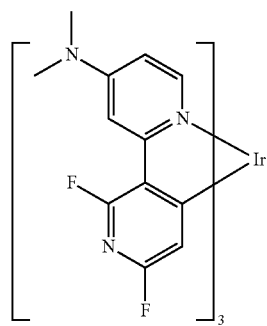
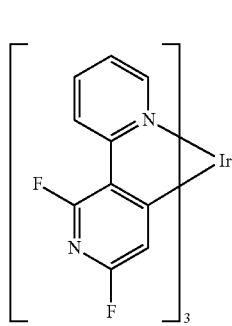
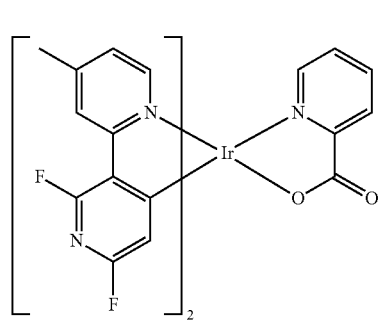
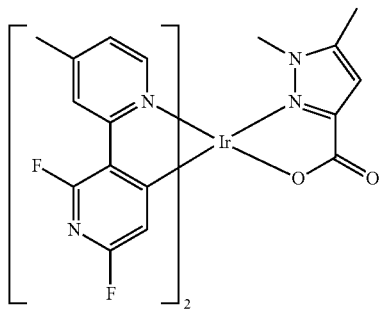
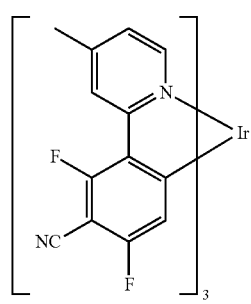
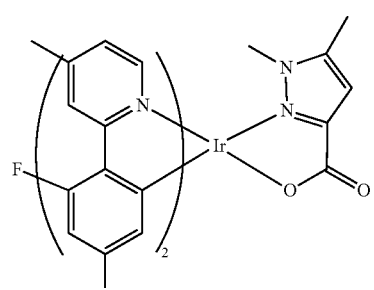
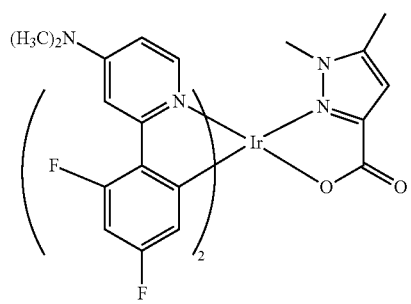
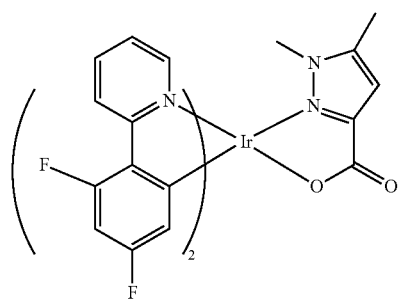
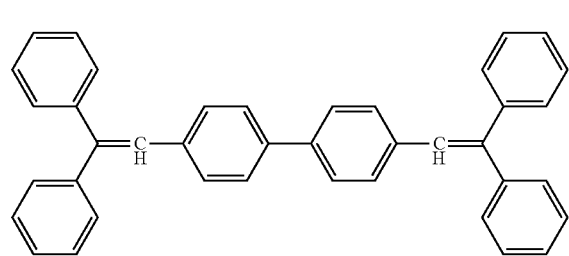
DPVBi

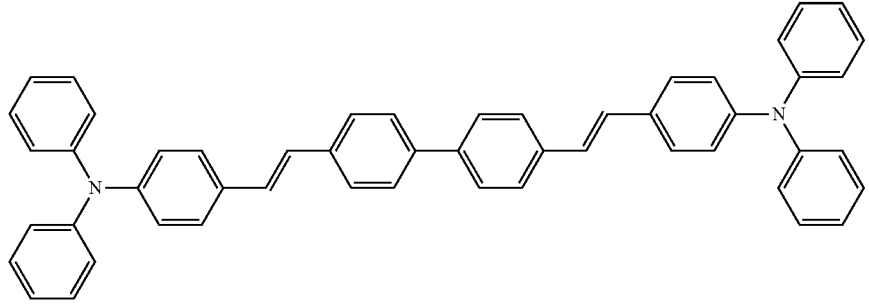
DPAVBi
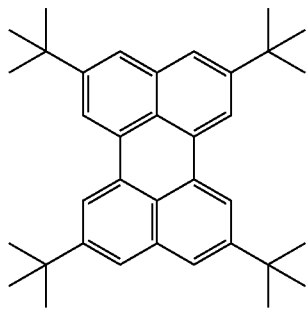
TBPe
For example, compounds illustrated below may be used as a red dopant, but the red dopant is not limited thereto.
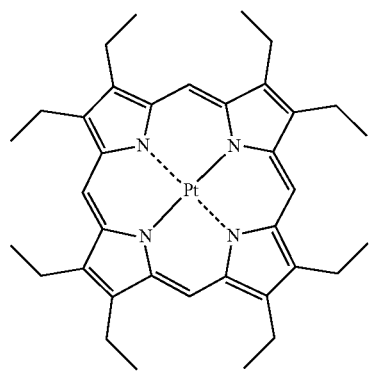
PtOEP
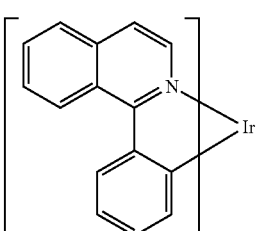
Ir(piq)$_3$
-continued
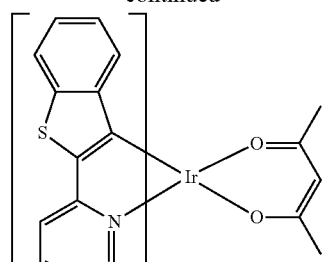
Btp$_2$Ir(acac)
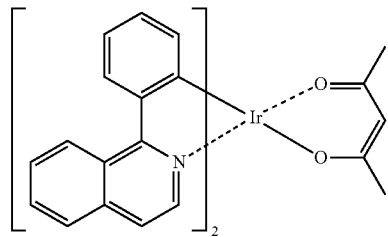
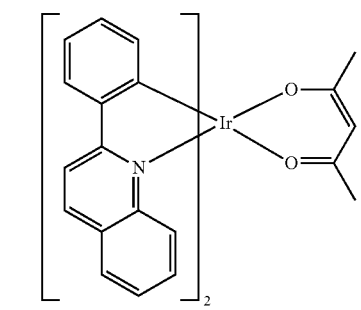
Ir(pq)$_2$(acac)

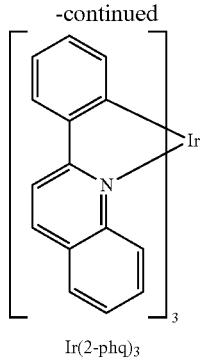
Ir(2-phq)₃
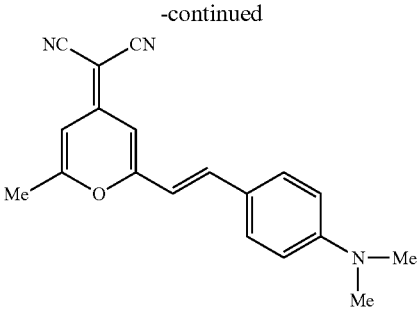
DCM
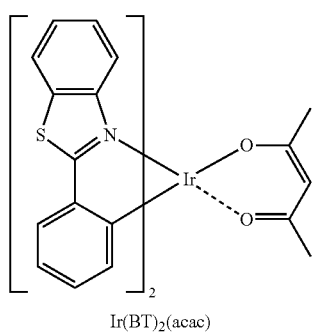
Ir(BT)₂(acac)
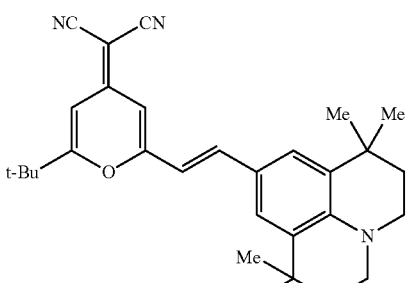
DCJTB
For example, compounds illustrated below may be used as a green dopant, but the green dopant is not limited thereto.
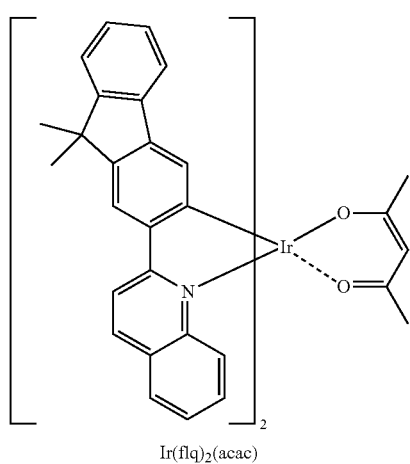
Ir(flq)₂(acac)
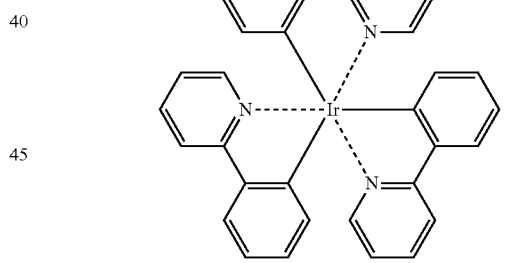
Ir(ppy)₃
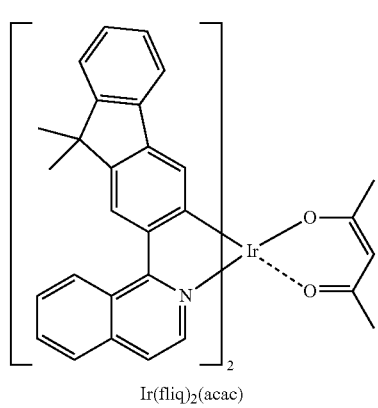
Ir(fliq)₂(acac)
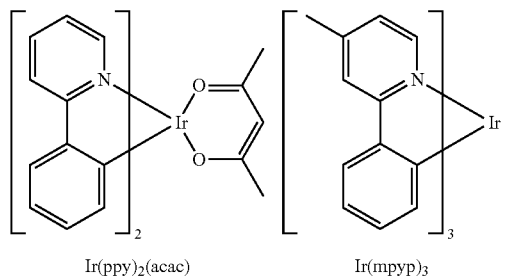
Ir(ppy)₂(acac)　　　Ir(mpyp)₃

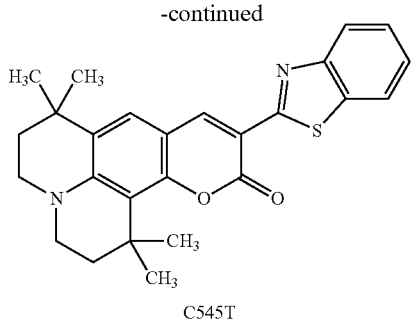
C545T
Also, the dopant available for use in the emission layer may be a complex described below, but is not limited thereto:
D1
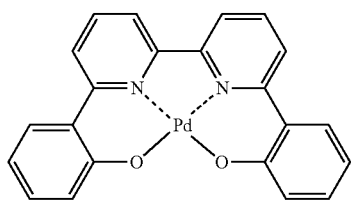
D2
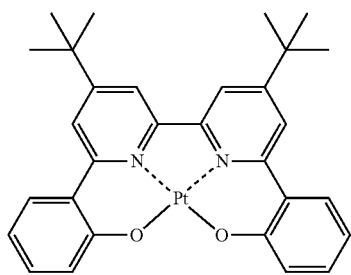
D3
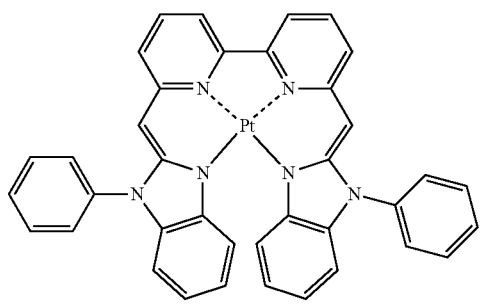
D4
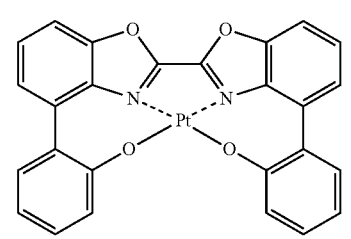
D5
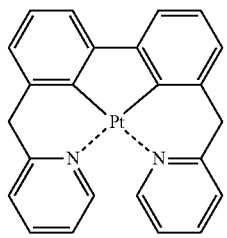
D6
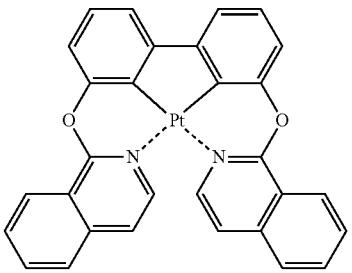
D7
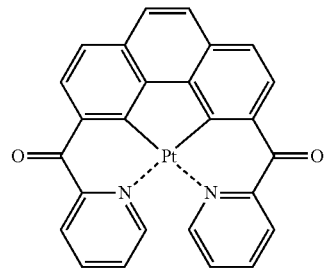
D8
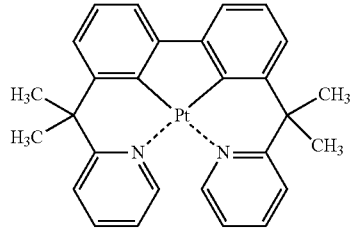
D9
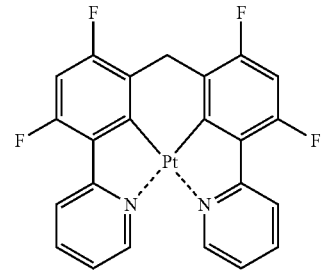
D10
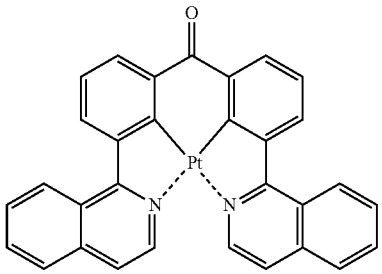

D11 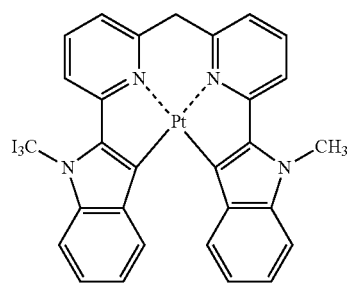
D12 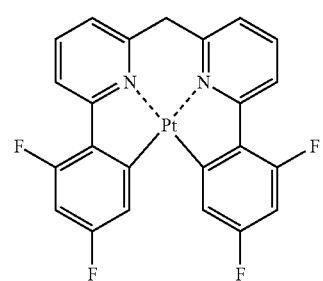
D13 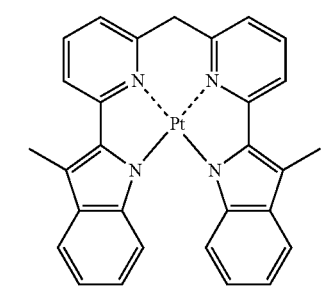
D14 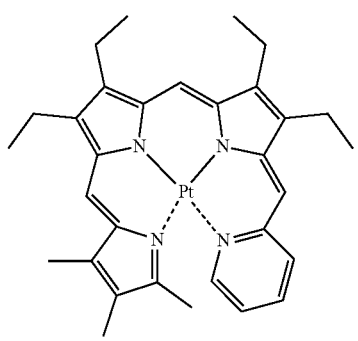
D15 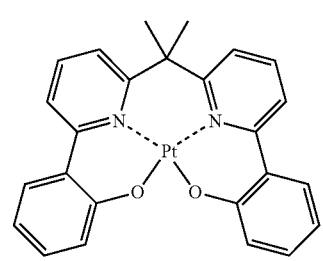
D16 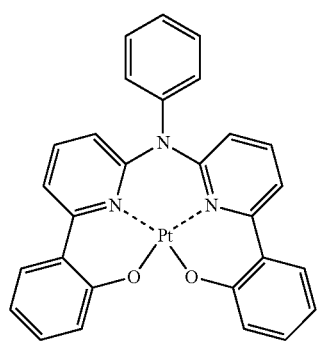
D17 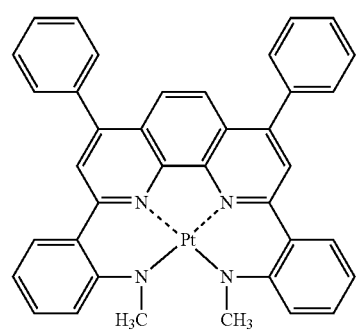
D18 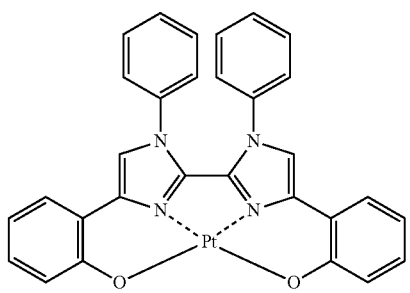
D19 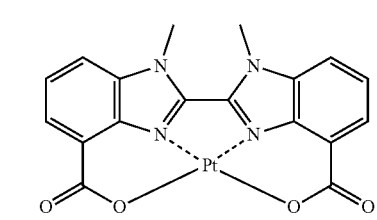
D20 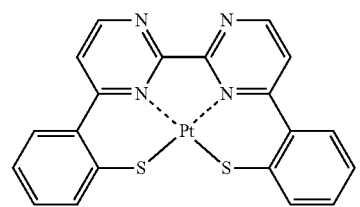

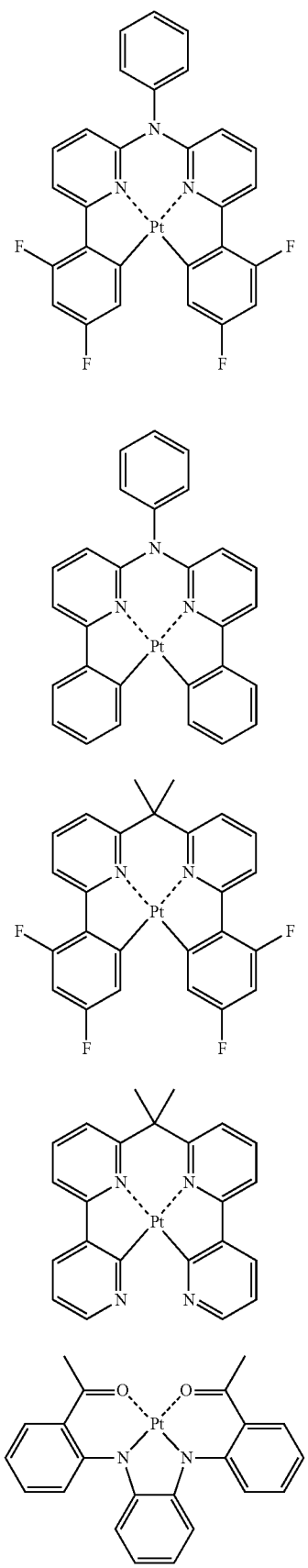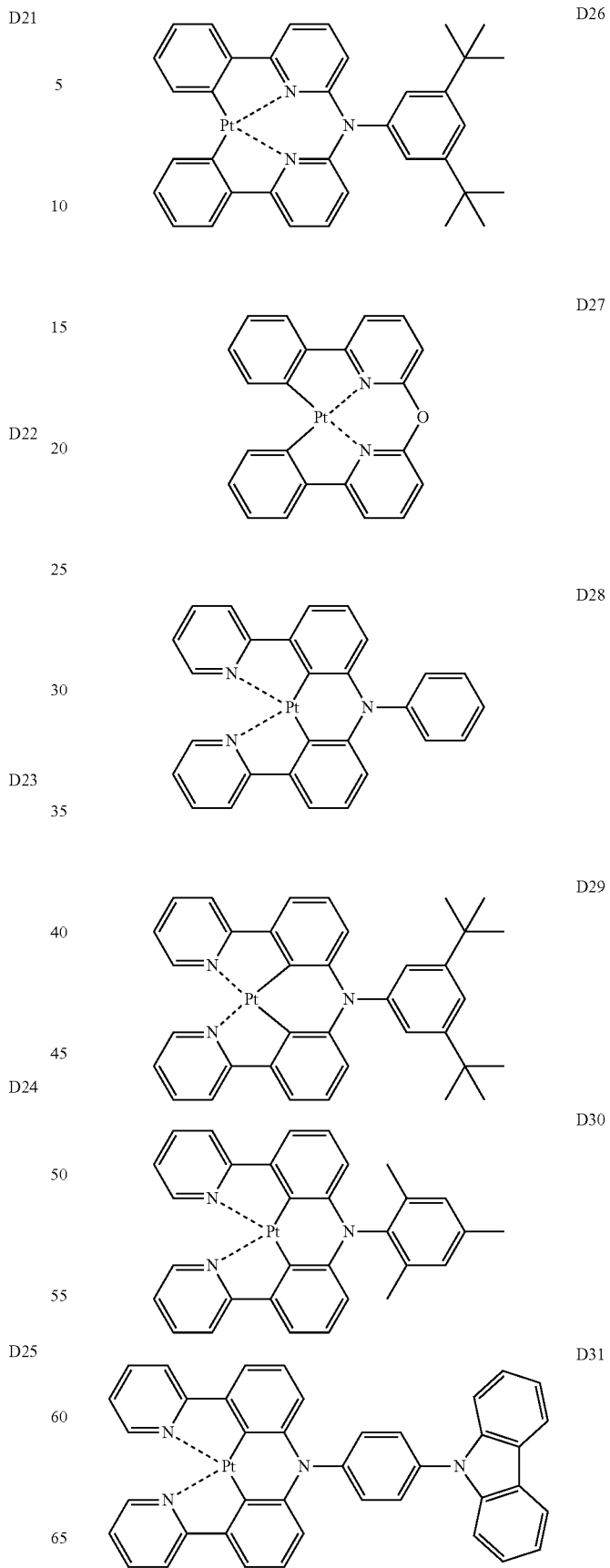

-continued
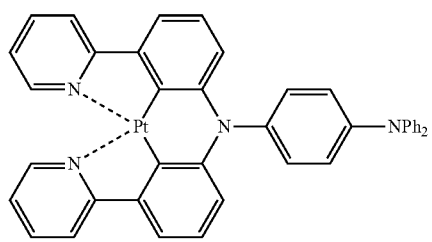
D32
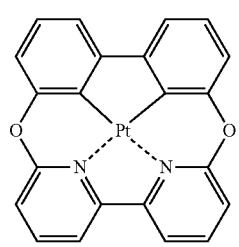
D33
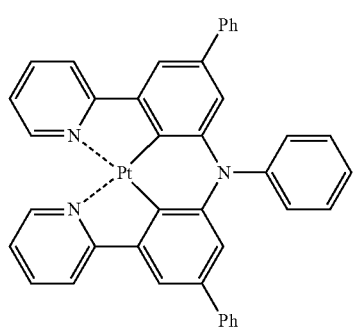
D34
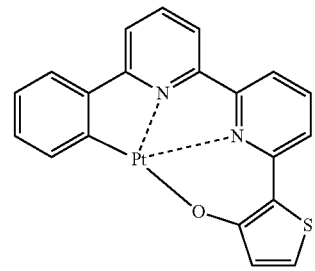
D35
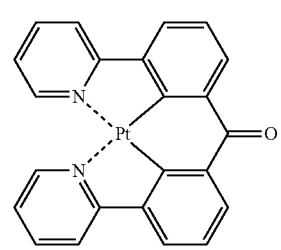
D36
-continued
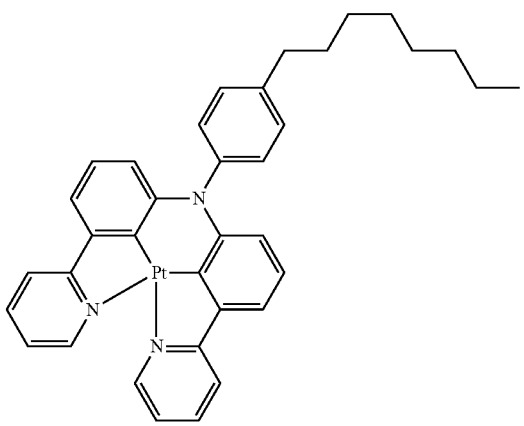
D37
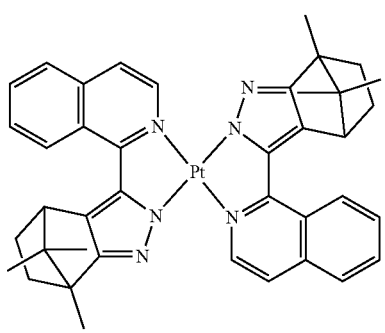
D38
D39
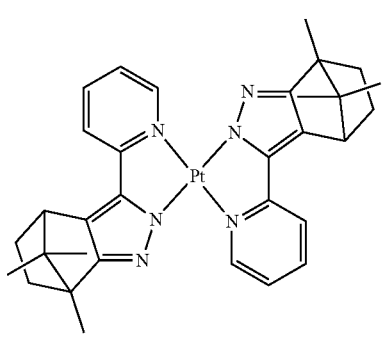
D40
D41

-continued
D42
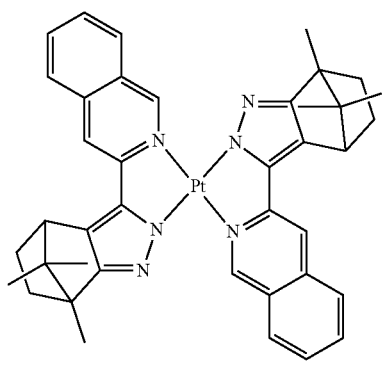
D43
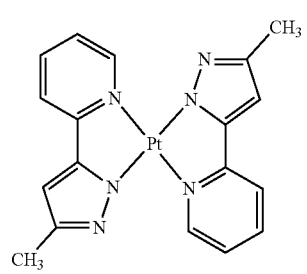
D44
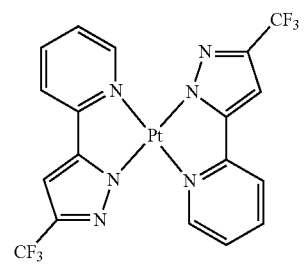
D45
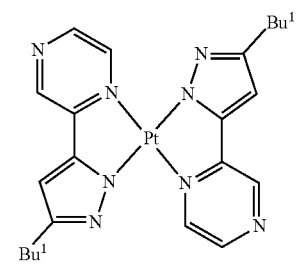
D46
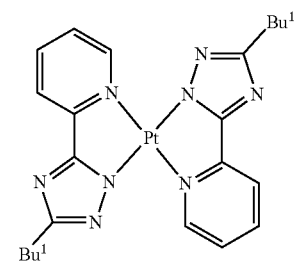
-continued
D47
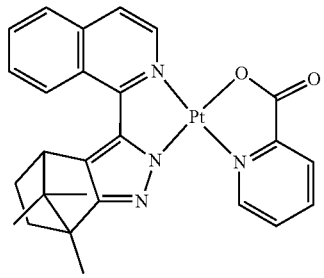
D48
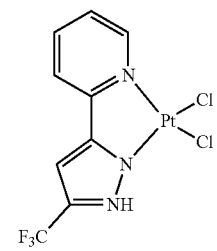
D49
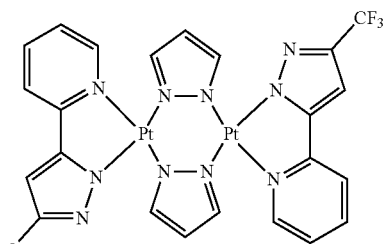
D50
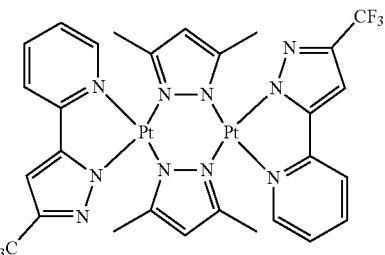
Also, the dopant available for use in the emission layer may be an Os-complex described below, but is not limited thereto:
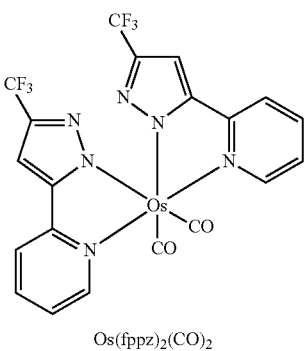
Os(fppz)$_2$(CO)$_2$

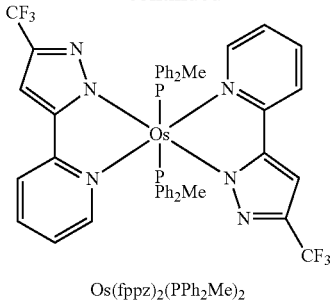

Os(fppz)₂(PPh₂Me)₂

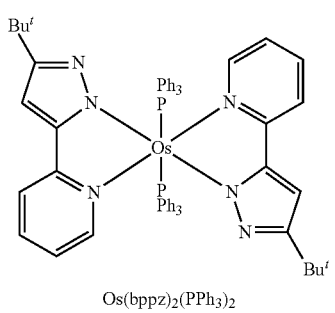

Os(bppz)₂(PPh₃)₂

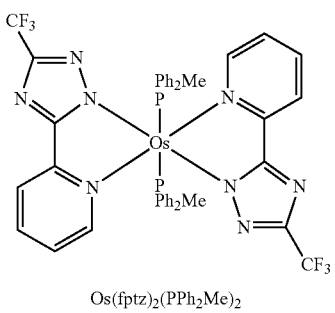

Os(fptz)₂(PPh₂Me)₂

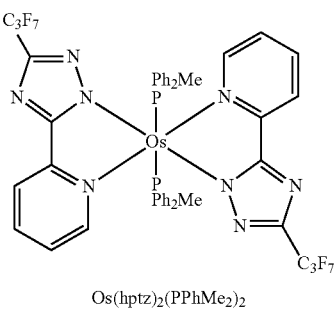

Os(hptz)₂(PPhMe₂)₂

When the emission layer includes a host and a dopant, an amount of the dopant may be in a range of about 0.01 to about 15 parts by weight based on 100 parts by weight of the host, but is not limited thereto.

In some embodiments, a thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Next, an electron transport layer (ETL) is formed on the emission layer by using various methods, for example, by vacuum deposition, spin coating, casting, or the like. When the electron transport layer is formed using vacuum deposition or spin coating, the deposition and coating conditions may be similar to those for the formation of the hole injection layer, though the conditions for deposition and coating may vary according to the material that is used to form the electron transport layer.

A material for forming the electron transport layer may stably transport electrons injected from an electron injection electrode (cathode), and may be a known electron transportation material. Examples of known electron transport materials are a quinoline derivative, such as tris(8-quinolinolate) aluminum (Alq3), TAZ, Balq, beryllium bis(benzoquinolin-10-olate) (Bebq₂), ADN, Compound 201, and Compound 202, but are not limited thereto.

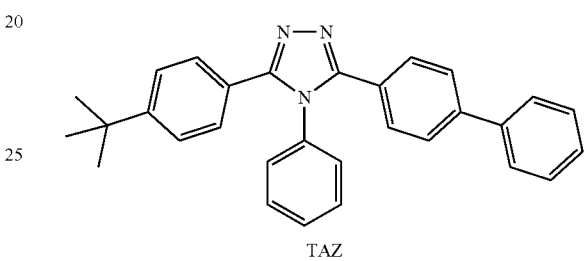

TAZ

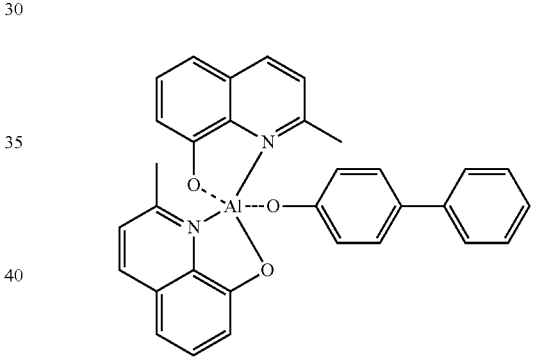

BAlq

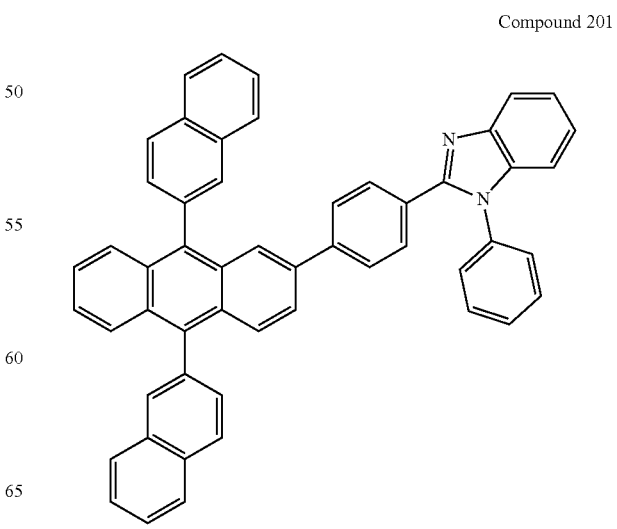

Compound 201

-continued

Compound 202

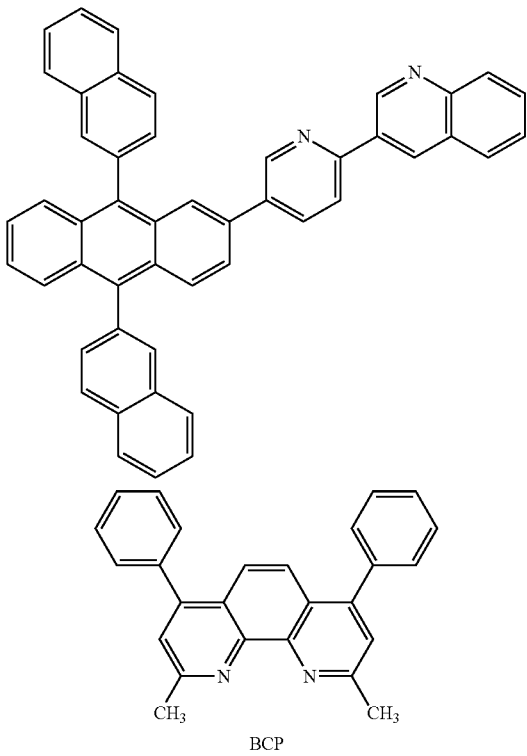

In some embodiments, a thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may include, in addition to an electron transport organic compound, a metal-containing material.

In some embodiments, the metal-containing material may include a Li complex. Non-limiting examples of the Li complex are lithium quinolate (LiQ) and Compound 203 illustrated:

Compound 203

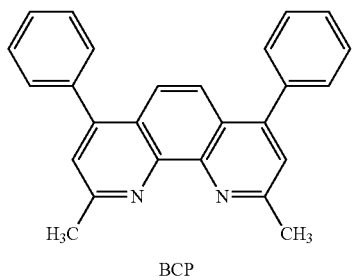 [SMILES: Cc1cc(-c2ccccc2)c2ccc3c(-c4ccccc4)cc(C)nc3c2n1 ; "BCP"]

Then, an electron injection layer, which facilitates injection of electrons from the cathode, may be formed on the electron transport layer. Any suitable electron injection material may be used to form the electron injection layer.

Non-limiting examples of electron injection materials are LiF, NaCl, CsF, $Li_2O$, and BaO, which are known in the art.

The deposition conditions of the electron injection layer may be similar to those used to form the hole injection layer, although the deposition conditions may vary according to the material that is used to form the electron injection layer.

In some embodiments, a thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

In some embodiments, a second electrode is disposed on the organic layer. In some embodiments, the second electrode may be a cathode that is an electron injection electrode, and in this regard, a metal for forming the second electrode may be a material having a low work function, and such a material may be metal, alloy, an electrically conductive compound, or a mixture thereof. For example, lithium (Li), magnesium (Mg), aluminum (Al), aluminum-lithium (Al—Li), calcium (Ca), magnesium-indium (Mg—In), or magnesium-silver (Mg—Ag) may be formed as a thin film to obtain a transmissive electrode. Also, to manufacture a top emission type light-emitting device, a transmissive electrode formed using ITO or IZO may be formed.

Hereinbefore, the organic light-emitting device has been described with reference to FIG. 1, but is not limited thereto.

In addition, when a phosphorescent dopant is used in the emission layer, a triplet exciton or a hole may diffuse to the electron transport layer. To prevent the diffusion, a hole blocking layer (HBL) may be formed between the hole transport layer and the emission layer or between the H-functional layer and the emission layer by vacuum deposition, spin coating, casting, LB deposition, or the like. When the hole blocking layer is formed by vacuum deposition or spin coating, the deposition or coating conditions may be similar to those applied to form the hole injection layer, although the deposition or coating conditions may vary according to the material that is used to form the hole blocking layer. A hole blocking material may be any one of known hole blocking materials, and examples thereof are an oxadiazole derivative, a triazole derivative, a phenanthroline derivative, and so on. For example, BCP illustrated below may be used as the hole-blocking material.

BCP

In some embodiments, a thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

An organic light-emitting device according to an embodiment may be used in various flat panel display apparatuses, such as a passive matrix organic light-emitting display apparatus or an active matrix organic light-emitting display apparatus. In particular, when the organic light-emitting device is included in an active matrix organic light-emitting display apparatus, a first electrode disposed on a substrate acts as a pixel and may be electrically connected to a source electrode or a drain electrode of a thin film transistor. In addition, the organic light-emitting device may be included in a flat panel display apparatus that emits light in opposite directions.

Also, an organic layer according to an embodiment may be formed by depositing the compound according to an embodiment of the present invention, or may be formed by using a wet method in which the compound according to an embodiment of the present invention is prepared in the form of solution and then the solution of the compound is used for coating.

Hereinafter, an organic light-emitting device according to an embodiment of the present invention is described in detail with reference to Synthesis Example and Examples. However, the organic light-emitting device is not limited thereto.

EXAMPLE

Synthesis Example 1: Synthesis of S-1, 2, 3, 5, and 12

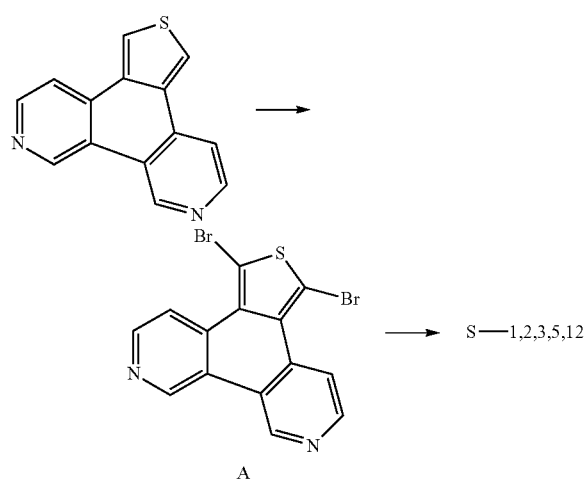

Synthesis of Intermediate A 50 g (1 eq, 0.211 mol) of thieno[3,4-f][2,9]phenanthroline was placed in a reaction vessel, and then, dissolved with 500 mL of $CBr_4$. A reactor was cooled by 0° C., and then, 33.7 g (1.1 eq, 0.23 mol) of bromine ($Br_2$) was slowly added thereto for 1 hour and then stirred at room temperature. After 3 hours, the reactor was cooled by a temperature of 0° C. and then, 33.7 g (1.1 eq, 0.23 mol) of bromine ($Br_2$) was slowly added thereto for 1 hour, and then, stirred at room temperature. Upon completion of the reaction a $NH_2SO_4$ saturated solution was added to the reaction vessel, followed by stifling to remove the remaining bromine. The layers were separated using a separatory funnel to obtain the organic layer, and then, hexane was added to the organic layer to cause the product to precipitate and recrystallization was performed on the obtained product to obtain Intermediate A.

HRMS for C14H6Br2N2S [M]+: calcd 394.08. found 393.

Synthesis of Compounds S-1 to 12

Synthesis of S-1

10 g (1 eq, 0.025 mol) of Intermediate A and 6.4 g (2.2 eq, 0.0525 mol) of phenylboronic acid were placed in a reaction vessel and dissolved with 400 mL of toluene. 0.612 g (0.02 eq, 0.0005 mmol) of $Pd(PPh_3)_4$, and 50 mL of $K_2CO_3$ 2 M solution were separately added thereto, and then, the mixture was stirred for 12 hours while heating. When the reaction stopped, the reaction solution was filtered through Celite, and then, subjected to column chromatography to obtain Compound S-1 in an amount of 6.97 g (yield=71.8%).

Elemental Analysis for C26H16N2S: calcd: C, 80.38; H, 4.15; N, 7.21; S, 8.25.

HRMS for C26H16N2S [M]+: calcd 388.48. found 387.

Synthesis of S-2

9.2 g (yield=75.6%) of S-2 was prepared in the same manner as in Synthesis of S-1, except that a naphthalen-2-ylboronic acid was used instead of a phenylboronic acid.

Elemental Analysis for C34H20N2S: calcd: C, 83.58; H, 4.13; N, 5.73; S, 6.56.

HRMS for C34H20N2S [M]+: calcd 488.6. found 467.

Synthesis of S-3

10 g (1 eq, 0.025 mol) of Intermediate A and 8.7 g (2.2 eq, 0.0525 mol) of 9H-carbazole were separately placed in a reaction vessel and then dissolved with 400 mL of toluene. 0.42 g (0.03 eq, 0.0005 m mol) of $Pd_2(dba)_3$, 2.74 g (1.1 eq, 0.0196 mol) of Na(t-bu)O, and 0.84 g (0.06 ea, 0.001 m mol) of $P(t-Bu)_3$ were separately added thereto, and additionally, 100 mL of toluene was added thereto, followed by stirring for 12 hours while heating. When the reaction stopped, the reaction solution was filtered through celite, and then subjected to column chromatography to obtain 11.2 g (yield=79.1%) of Compound S-3.

Elemental Analysis for C38H22N4S: calcd: C, 80.54; H, 3.91; N, 9.89; S, 5.66.

HRMS for C38H22N4S [M]+: calcd 566.67. found 565.

Synthesis of S-5

9.2 g (yield=77.9%) of S-5 was prepared in the same manner as in Synthesis of S-1, except that a dibenzo[b,d]thiophen-4-ylboronic acid was used instead of a phenylboronic acid.

Elemental Analysis for C38H20N2S3: calcd: C, 75.97; H, 3.36; N, 4.66; S, 16.01.

HRMS for C38H20N2S3 [M]+: calcd 600.77. found 599.

Synthesis of S-12

9.2 g (yield=77.9%) of S-12 was prepared in the same manner as in Synthesis of S-1, except that 2-(trichlorostannyl)pyridine was used instead of a phenylboronic acid.

Elemental Analysis for C24H14N4S: calcd: C, 73.82; H, 3.61; N, 14.35; S, 8.21.

HRMS for C24H14N4S [M]+: calcd 390.46. found 389.

Synthesis Example 2: Synthesis of S-18, 20, 25, 29, and 31

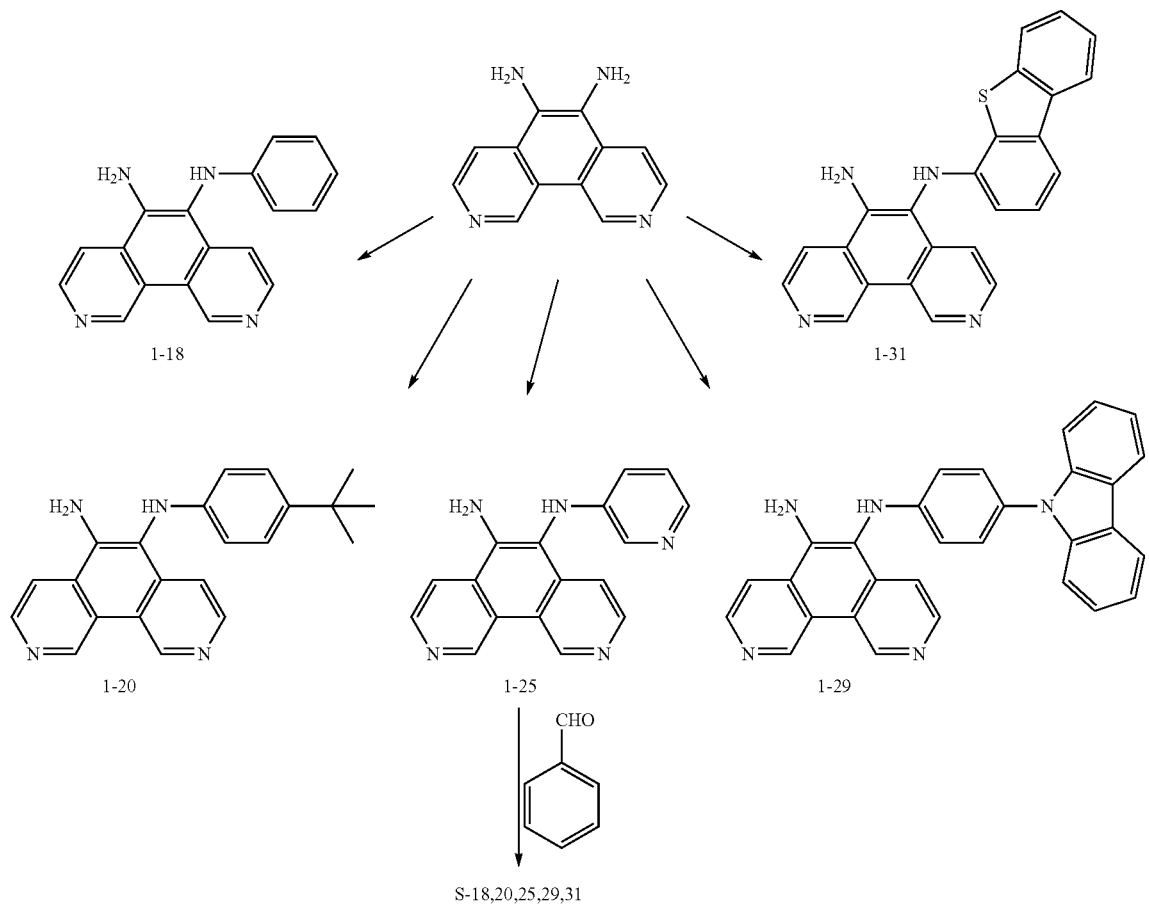

Synthesis of 1-18

10 g (1 eq, 0.047 mol) of Intermediate 2,9-phenanthroline-5,6-diamine and 8.1 g (1.1 eq, 0.0517 mol) of bromobenzene were separately placed in a reaction vessel and then dissolved with 300 mL of toluene. 0.27 g (0.03 eq, 0.0001 mmol) of $Pd_2(dba)_3$, 3.74 g (1.1 eq, 0.0517 mol) of Na(t-bu)O, and 0.84 g (0.06 ea, 0.002 mmol) of $P(t-Bu)_3$ were separately added thereto, and additionally, 100 mL of toluene was added thereto, followed by stirring for 12 hours while heating. Upon completion of the reaction, the reaction solution was filtered through celite, and then subjected to column chromatography to obtain 11.16 g (yield=83%) of Intermediate 1-18.

Elemental Analysis for C18H14N4: calcd: C, 75.50; H, 4.93; N, 19.57.

HRMS for C18H14N4 [M]+: calcd 286.33. found 285.

Synthesis of 1-20

12.7 g (yield=82.9%) of 1-20 was prepared in the same manner as in Synthesis of 1-18, except that 1-bromo-4-tert-butylbenzene was used instead of boromobenzene.

Elemental Analysis for C22H22N4: calcd: C, 77.16; H, 6.48; N, 16.36.

HRMS for C22H22N4 [M]+: calcd 342.44. found 341.

Synthesis of 1-25

10.1 g (yield=77.5%) of 1-25 was prepared in the same manner as in Synthesis of 1-18, except that 3-bromopyridine was used instead of boromobenzene.

Elemental Analysis for C17H13N5: calcd: C, 71.06; H, 4.56; N, 24.37.

HRMS for C17H13N5 [M]+: calcd 287.32. found 286.

Synthesis of 1-29

10.5 g (yield=72.5%) of 1-29 was prepared in the same manner as in Synthesis of 1-18, except that 9-(4-bromophenyl)-9H-carbazole was used instead of boromobenzene.

Elemental Analysis for C30H21N5: calcd: C, 67.10; H, 3.75; Br, 24.80; N, 4.35.

HRMS for C30H21N5 [M]+: calcd 451.52. found 450.

Synthesis of 1-31

10.5 g (yield=72.5%) of 1-31 was prepared in the same manner as in Synthesis of 1-18, except that 4-bromodibenzo[b,d]thiophene was used instead of boromobenzene.

Elemental Analysis for C24H16N4S: calcd: C, 73.45; H, 4.11; N, 14.28; S, 8.17.

HRMS for C24H16N4S [M]+: calcd 392.48. found 391.

Synthesis of S-18

11 g (1 eq, 0.0384 mol) of 1-18 and 4.48 g (1.1 eq, 0.0422 mol) of benzaldehyde were dissolved in a mixed solution including 50 mL of an acetic acid, and 200 mL (1:4) of toluene, and then, the resultant mixture was stirred for 3 days while refluxing. A toluene layer was extracted and then washed with water, and then, dried by using magnesium-sulfate anhydrous, and allowed to pass through a silica gel layer, and a solvent was removed therefrom to obtain a solid compound. The solid compound was subjected to column chromatography to obtain 6.8 g (yield 47.8%) of S-18, which was a final product.

Elemental Analysis for C25H16N4: calcd: C, 80.63; H, 4.33; N, 15.04.

HRMS for C25H16N4 [M]+: calcd 372.42. found 371.

Synthesis of S-20

8.4 g (yield=52.1%) of S-20 was prepared in the same manner as in Synthesis of S1-18, except that Intermediate 1-20 was used instead of Intermediate 1-18.

Elemental Analysis for $C_{29}H_{24}N_4$: calcd: C, 81.28; H, 5.65; N, 13.07.

HRMS for $C_{29}H_{24}N_4$ [M]+: calcd 428.53. found 427.

Synthesis of S-25

7.2 g (yield=49.7%) of S-25 was prepared in the same manner as in Synthesis of S1-18, except that Intermediate 1-25 was used instead of Intermediate 1-18.

Elemental Analysis for C24H15N5: calcd: C, 77.20; H, 4.05; N, 18.76.

HRMS for C24H15N5 [M]+: calcd 373.41. found 372.

Synthesis of S-29

6.7 g (yield=41.5%) of S-29 was prepared in the same manner as in Synthesis of S1-18, except that Intermediate 1-29 was used instead of Intermediate 1-18.

Elemental Analysis for $C_{37}H_{23}N_5$: calcd: C, 82.66; H, 4.31; N, 13.03.

HRMS for $C_{37}H_{23}N_5$ [M]+: calcd 537.61. found 536.

Synthesis of S-31

6.2 g (yield=43.6%) of S-31 was prepared in the same manner as in Synthesis of S1-18, except that Intermediate 1-31 was used instead of Intermediate 1-18.

Elemental Analysis for $C_{31}H_{18}N_4S$: calcd: C, 77.80; H, 3.79; N, 11.71; S, 6.70.

HRMS for $C_{31}H_{18}N_4S$ [M]+: calcd 478.57. found 477.

Synthesis of S-33

10 g (1 eq, 0.016 mol) of 1,3,10,12-tetrabromobenzo[h]dithieno[3,4-c:3',4'-f]isoquinoline and 10.1 g (5 eq, 0.0823 mol) of a phenylboronic acid were placed in a reaction vessel, and then, dissolved with 400 mL of toluene. 0.369 g (0.02 eq, 0.0003 mmol) of Pd(PPh3)4, and 60 ml of K2CO3 2 M solution were separately added thereto, and then, the mixture was stirred for 24 hours while heating. When the reaction stopped, the reaction solution was filtered through Celite, and then, subjected to column chromatography to obtain Compound S-33 in an amount of 3.54 g (yield=37.2%).

Elemental Analysis for $C_{41}H_{25}NS_2$: calcd: C, 82.66; H, 4.23; N, 2.35; S, 10.76.

HRMS for $C_{41}H_{25}NS_2$ [M]+: calcd 595.77. found 594.

Example 1

An anode was prepared by cutting a Corning 15 Ωcm² (500 Å) ITO glass substrate to a size of 50 mm×50 mm×0.5 mm, ultrasonically cleaning the glass substrate by using isopropyl alcohol and pure water for 10 minutes each, and then irradiating UV light for 10 minutes thereto and exposing to ozone to clean. Then, the anode was loaded onto a vacuum deposition apparatus. Then, 2-TNATA was vacuum deposited thereon to form a hole injection layer having a thickness of 600 Å, and then, 4,4'-bis[N-(1-naphthyl)-N-phenylamino]biphenyl (NPB), which is a known hole transport compound, was deposited on the hole injection layer to form a hole transport layer having a thickness of 300 Å.

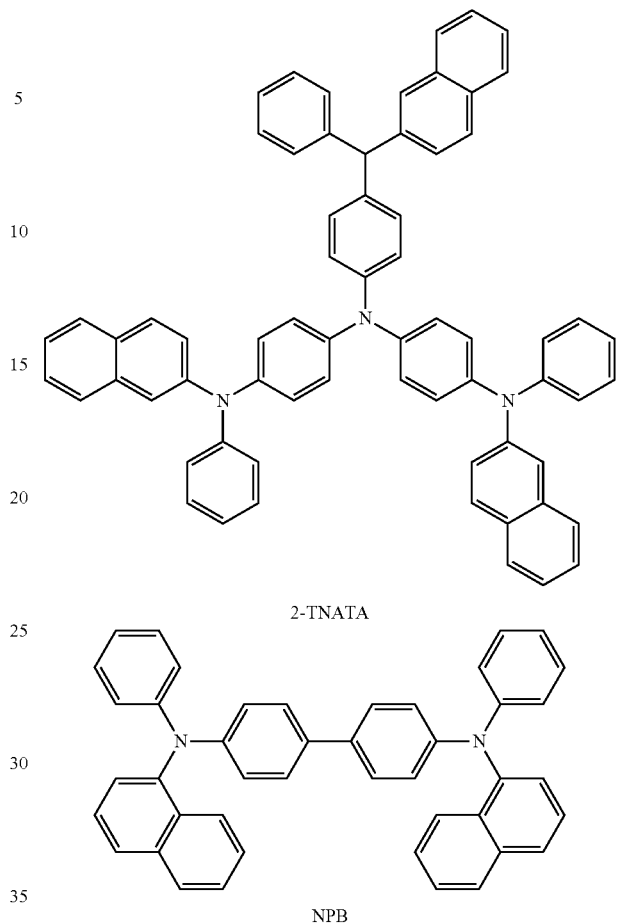

2-TNATA

NPB

Ir(ppy)3 [bis-(1-phenylisoquinolyl)iridium(III)acetylacetonate], which is a green phosphorescent dopant, and S-1 were co-deposited on the hole transport layer at a weight ratio of 15:85 to form an emission layer having a thickness of 300 Å. Then, Alq3 was deposited on the emission layer to form an electron transport layer having a thickness of 300 Å, and then, Al was vacuum deposited to form an Al electrode having a thickness of 1200 Å (cathode), thereby completing manufacturing of a organic light-emitting device.

Example 2

An organic light-emitting device was manufactured in the same manner as in Example 1, except that in forming the emission layer, S-2 was used instead of S-1.

Example 3

An organic light-emitting device was manufactured in the same manner as in Example 1, except that in forming the emission layer, S-3 was used instead of S-1.

Example 4

An organic light-emitting device was manufactured in the same manner as in Example 1, except that in forming the emission layer, S-5 was used instead of S-1.

Example 5

An organic light-emitting device was manufactured in the same manner as in Example 1, except that in forming the emission layer, S-12 was used instead of S-1.

Example 6

An organic light-emitting device was manufactured in the same manner as in Example 1, except that in forming the emission layer, S-18 was used instead of S-1.

Example 7

An organic light-emitting device was manufactured in the same manner as in Example 1, except that in forming the emission layer, S-20 was used instead of S-1.

Example 8

An organic light-emitting device was manufactured in the same manner as in Example 1, except that in forming the emission layer, S-25 was used instead of S-1.

Example 9

An organic light-emitting device was manufactured in the same manner as in Example 1, except that in forming the emission layer, S-29 was used instead of S-1.

Example 10

An organic light-emitting device was manufactured in the same manner as in Example 1, except that in forming the emission layer, S-31 was used instead of S-1.

Example 11

An organic light-emitting device was manufactured in the same manner as in Example 1, except that in forming the emission layer, S-33 was used instead of S-1.

Comparative Example

An organic light-emitting device was manufactured in the same manner as in Example 1, except that in forming the emission layer, CBP, which is a known host material, was used instead of S-1, and bis(2-methyl-8-quinolinato)(p-phenylphenolato)aluminum (III) (BAlq) was used to form a hole blocking layer.

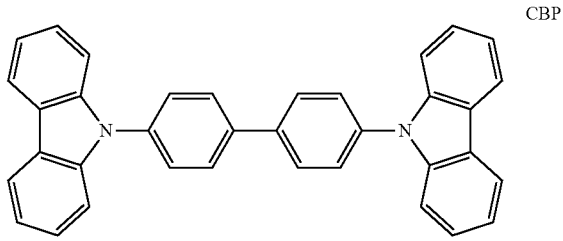 [SMILES: c1ccc2c(c1)c1ccccc1n2-c1ccc(-c2ccc(-n3c4ccccc4c4ccccc43)cc2)cc1]

CBP

As described above, when compounds represented by Formula 1 according to embodiments of the present invention are used as a phosphorescent host, they all provide a smaller driving voltage than CBP, which is a known material, by 10% or more, and have high efficiency and excellent I-V-L characterizes. In particular, lifespan improvement characteristics thereof improved: the organic light-emitting devices manufactured according to Examples 1 to 11 have a longer lifespan than that of Comparative Example 1 by 20% or more. Measurements and lifespans of the organic light-emitting devices manufactured according to Examples 1-11 are shown in Table 1 below.

TABLE 1

| | Luminescent material | Voltage | Efficiency | T95 lifespan (hr @100 mA/cm$^2$) |
|---|---|---|---|---|
| Example 1 | S-1 | 5.4 | 46.4 | 970 |
| Example 2 | S-2 | 6.1 | 49.0 | 943 |
| Example 3 | S-3 | 5.9 | 49.2 | 921 |
| Example 4 | S-5 | 6.2 | 42.0 | 937 |
| Example 5 | S-12 | 6.3 | 47.9 | 897 |
| Example 6 | S-18 | 5.7 | 48.8 | 911 |
| Example 7 | S-20 | 5.9 | 47.9 | 956 |
| Example 8 | S-25 | 6.7 | 47.7 | 923 |
| Example 9 | S-29 | 6.9 | 48.1 | 970 |
| Example 10 | S-31 | 5.6 | 48.0 | 921 |
| Example 11 | S-33 | 5.9 | 51.0 | 942 |
| Comparative Example | CBP | 7.1 | 38.4 | 789 |

As described above, it was confirmed that compounds represented by Formula 1 have better luminescent characteristics than those of a conventional material. Also, a device using an organic luminescent compound according to embodiments disclosed herein as a host material for luminescence has, even without use of a hole blocking layer in the structure thereof, excellent luminescent characteristics and a lower driving voltage, thereby inducing a higher power efficiency and more efficient consumption power.

Compounds represented by Formula 1 have excellent material stabilities and are suitable for use as a luminescent material. An organic light-emitting device manufactured using the compound has high efficiency, low voltage, high brightness, and a long lifespan.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present embodiments as defined by the following claims.

What is claimed is:

1. A compound represented by Formula 1:

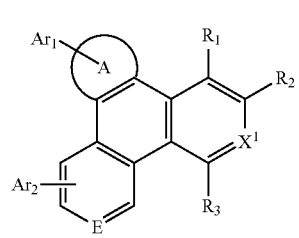

Formula 1 wherein in Formula 1,
A is a fused $C_2$-$C_4$ 5-membered heteroaryl ring;
E and $X^1$ are each independently CH or N (nitrogen);

$R_1$ to $R_3$ are each independently a hydrogen atom, a deuterium atom, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group, or optionally $R_1$ and $R_2$ together with the atoms to which they are attached is a ring; and, $Ar_1$ and $Ar_2$ are each independently a hydrogen, a deuterium, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group, provided E and $X^1$ are not both CH.

2. The compound of claim 1, wherein:
A is a thiophene moiety or an imidazole moiety.

3. The compound of claim 1, wherein:
$R_1$ and $R_2$ together with the atoms to which they are attached is a ring; and the ring is a heteroaryl ring.

4. The compound of claim 1, wherein:
the compound represented by Formula 1 is a compound represented by Formula 2:

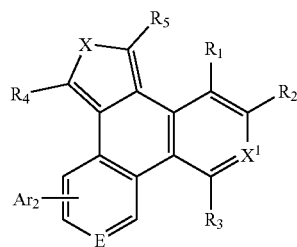

Formula 2 in Formula 2,
X is S (sulfur) or $NR_{100}$, and
$R_4$, $R_5$, and $R_{100}$ are each independently a hydrogen atom, a deuterium atom, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group.

5. The compound of claim 1, wherein:
the compound represented by Formula 1 is a compound represented by Formula 3:

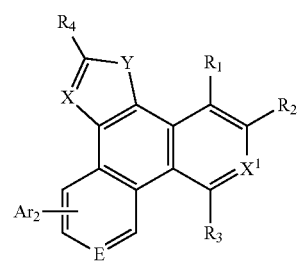

Formula 3 in Formula 3,
X and Y are each independently S (sulfur), N (nitrogen), or $NR_{100}$, and
$R_4$, and $R_{100}$ are each independently a hydrogen atom, a deuterium atom, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group.

6. The compound of claim 1, wherein
the compound represented by Formula 1 is a compound represented by Formula 4:

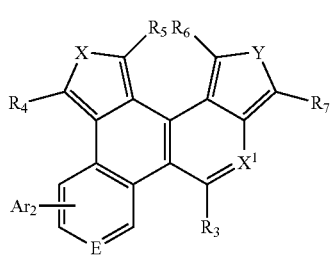

Formula 4 in Formula 4,
X and Y are each independently S (sulfur) or $NR_{100}$, and
$R_4$ to $R_7$, and $R_{100}$ are each independently a hydrogen atom, a deuterium atom, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group.

7. The compound of claim 1, wherein
the compound represented by Formula 1 is a compound represented by Formula 5:

Formula 5

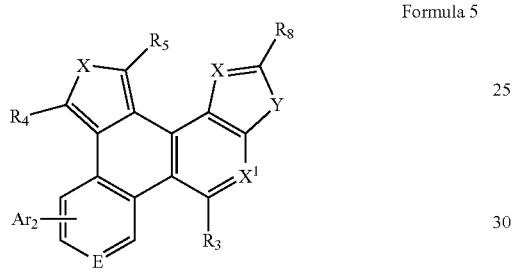

in Formula 5,

X and Y are each independently S (sulfur), N (nitrogen), or $NR_{100}$, and $R_4$, $R_5$, $R_8$, and $R_{100}$ are each independently a hydrogen atom, a deuterium atom, a halogen atom, an amino group, a nitro group, a nitryl group, a substituted or unsubstituted $C_1$ to $C_{40}$ alkyl group, a substituted or unsubstituted $C_2$ to $C_{40}$ alkenyl group, a substituted or unsubstituted $C_2$ to $C_{40}$ alkynyl group, a substituted or unsubstituted $C_6$ to $C_{40}$ aryl group, a substituted or unsubstituted $C_1$ to $C_{40}$ heteroaryl group, a substituted or unsubstituted $C_1$ to $C_{40}$ alkoxy group, a substituted or unsubstituted $C_6$ to $C_{40}$ aryloxy group, a $C_1$ to $C_{40}$ alkylamino group, a $C_6$ to $C_{40}$ arylamino group, a $C_6$ to $C_{40}$ diarylamino group, a $C_1$ to $C_{40}$ heteroarylamino group, a $C_2$ to $C_{40}$ diheteroarylamino group, a $C_6$ to $C_{40}$ arylalkyl group, a $C_6$ to $C_{40}$ heteroarylalkyl group, a substituted or unsubstituted $C_3$ to $C_{40}$ cycloalkyl group, a $C_3$ to $C_{40}$ heterocycloalkyl group, a $C_3$ to $C_{40}$ alkylsilyl group, a $C_6$ to $C_{40}$ arylsilyl group, or a $C_1$ to $C_{40}$ heteroarylsilyl group.

8. The compound of claim 1, wherein:
$Ar_2$ and $R_3$ is a hydrogen or a deuterium.

9. The compound of claim 4, wherein:
$R_4$ and $R_5$ in Formula 2 are each independently one of Formulae 2a to 2e:

2a

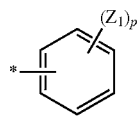

2b

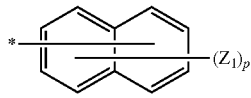

2c

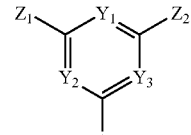

2d

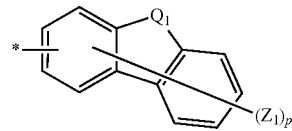

2e

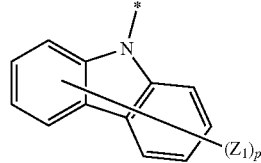

wherein in Formulae 2a to 2e, $Q_1$ is S (sulfur), $CR_{51}R_{52}$, or $NR_{53}$, $Y_1$ to $Y_3$ are each independently CH or N (nitrogen), $Z_1$, $Z_2$, $R_{51}$, $R_{52}$, and $R_{53}$ are each independently a hydrogen, a deuterium, a substituted or unsubstituted $C_1$ to $C_{20}$ alkyl group, a substituted or unsubstituted $C_6$ to $C_{20}$ aryl group, a substituted or unsubstituted $C_1$ to $C_{20}$ heteroaryl group, a substituted or unsubstituted $C_6$ to $C_{20}$ condensed polycyclic group, a halogen atom, a cyano group, a nitro group, a hydroxy group, or a carboxy group;

p is an integer of 1 to 8; and

* indicates an attachment position.

10. The compound of claim 4, wherein:

$R_1$ and $R_2$ in Formula 2 is a hydrogen or a deuterium.

11. The compound of claim 5, wherein:

$R_4$ in Formula 3 is represented by Formula 3a:

3a

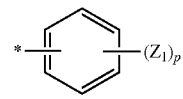

wherein in Formula 3a, $Z_1$ is a hydrogen, a deuterium, a substituted or unsubstituted $C_1$ to $C_{20}$ alkyl group, a substituted or unsubstituted $C_6$ to $C_{20}$ aryl group, a substituted or unsubstituted $C_1$ to $C_{20}$ heteroaryl group, a substituted or unsubstituted $C_6$ to $C_{20}$ condensed polycyclic group, a halogen atom, a cyano group, a nitro group, a hydroxy group, or a carboxy group;

p is an integer of 1 to 5; and

* indicates an attachment position.

12. The compound of claim 5, wherein:
$R_{100}$ in Formula 3 is one of Formulae 4a to 4c:

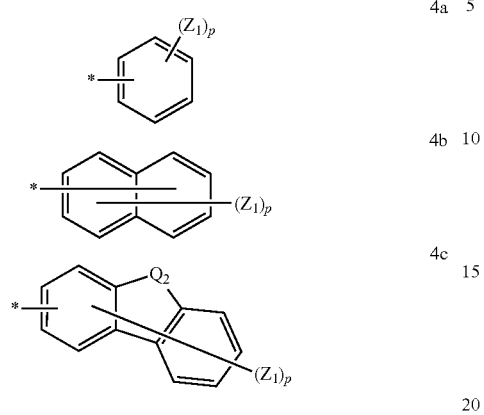

wherein in Formulae 4a to 4c,
$Q_2$ is S (sulfur), $CR_{51}R_{52}$, or $NR_{53}$,
$Z_1$, $R_{51}$, $R_{52}$, and $R_{53}$ are each independently a hydrogen, a deuterium, a substituted or unsubstituted $C_1$ to $C_{20}$ alkyl group, a substituted or unsubstituted $C_6$ to $C_{20}$ aryl group, a substituted or unsubstituted $C_1$ to $C_{20}$ heteroaryl group, a substituted or unsubstituted $C_6$ to $C_{20}$ condensed polycyclic group, a halogen atom, a cyano group, a nitro group, a hydroxy group, or a carboxy group;
p is an integer of 1 to 7; and
* indicates an attachment position.

13. The compound of claim 5, wherein:
$R_1$ and $R_3$ in Formula 3 is a hydrogen or a deuterium.

14. The compound of claim 6, wherein:
$R_5$, $R_6$, and $R_7$ in Formula 4 are each independently one of Formulae 5a to 5c:

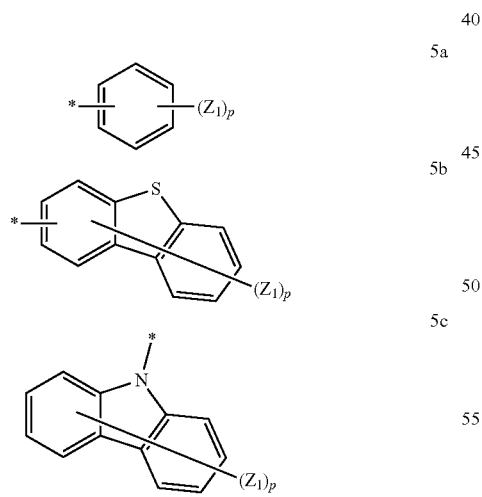

wherein in Formulae 5a to 5c,
$Z_1$ is a hydrogen, a deuterium, a substituted or unsubstituted $C_1$ to $C_{20}$ alkyl group, a substituted or unsubstituted $C_6$ to $C_{20}$ aryl group, a substituted or unsubstituted $C_1$ to $C_{20}$ heteroaryl group, a substituted or unsubstituted $C_6$ to $C_{20}$ condensed polycyclic group, a halogen atom, a cyano group, a nitro group, a hydroxy group, or a carboxy group;

p is an integer of 1 to 8; and
* indicates an attachment position.

15. The compound of claim 7, wherein
$R_4$, $R_5$, $R_8$, and $R_{100}$ in Formula 5 are each independently one of Formulae 6a to 6c:

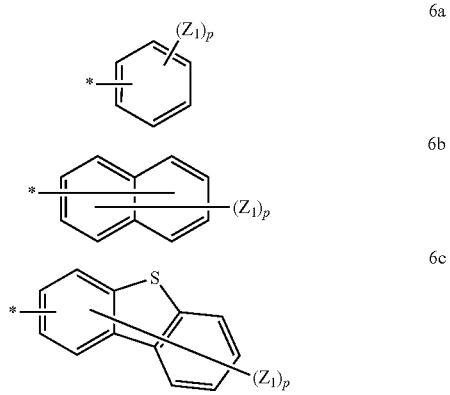

wherein in Formulae 6a to 6c,
$Z_1$ is a hydrogen, a deuterium, a substituted or unsubstituted $C_1$ to $C_{20}$ alkyl group, a substituted or unsubstituted $C_6$ to $C_{20}$ aryl group, a substituted or unsubstituted $C_1$ to $C_{20}$ heteroaryl group, a substituted or unsubstituted $C_6$ to $C_{20}$ condensed polycyclic group, a halogen atom, a cyano group, a nitro group, a hydroxy group, or a carboxy group;
p is an integer of 1 to 7; and
* indicates an attachment position.

16. The compound of claim 1, wherein:
the compound of Formula 1 is any one of compounds below:

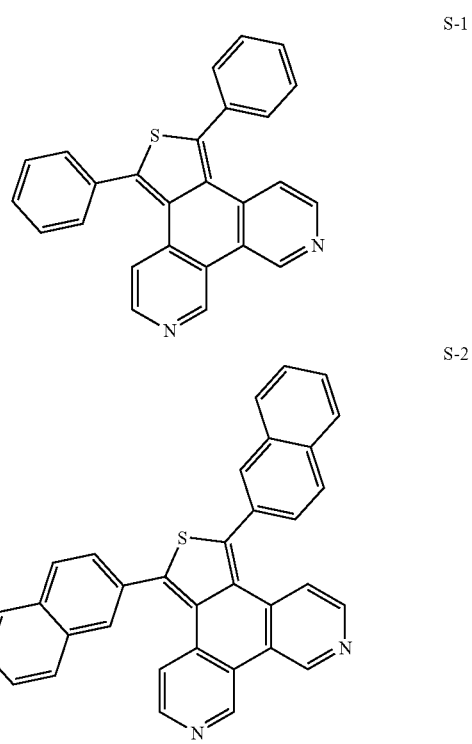

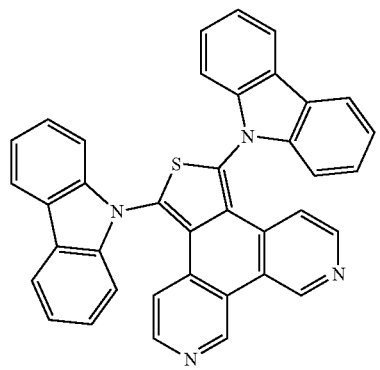
S-3
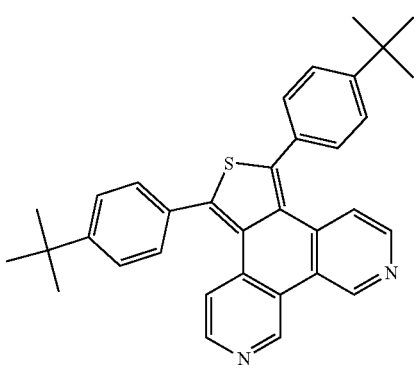
S-7

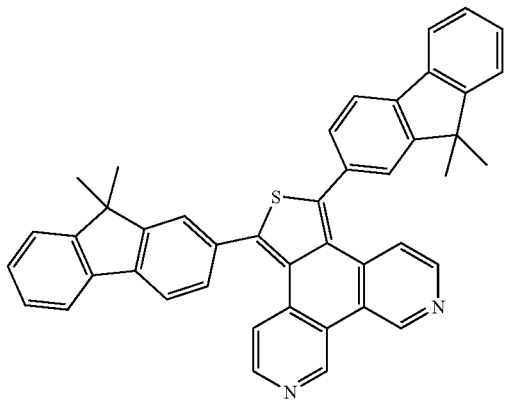
S-11
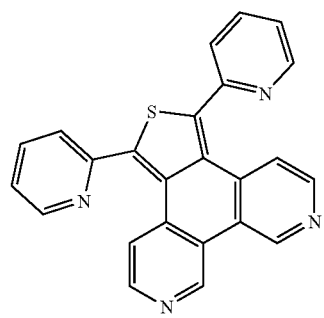
S-12
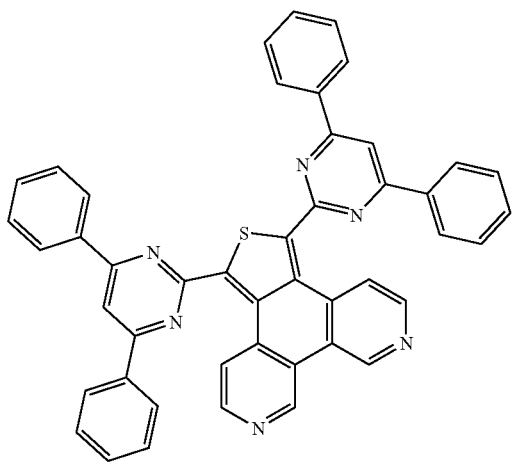
S-13
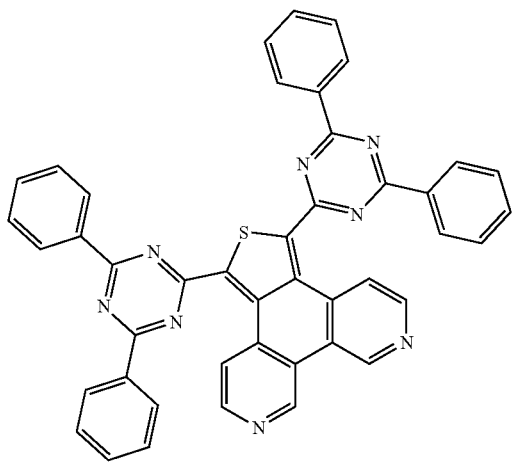
S-14
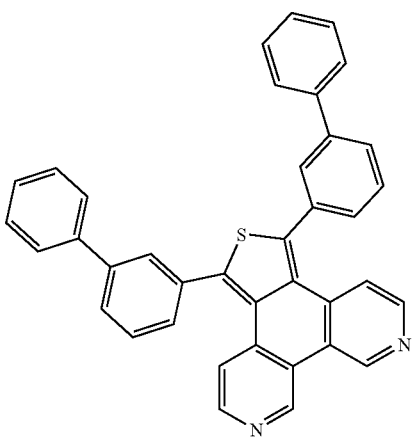
S-15
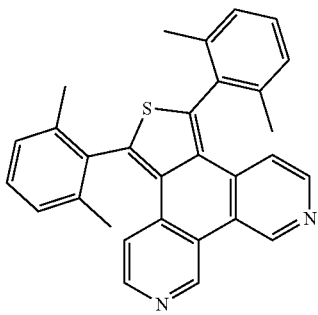
S-16

S-17
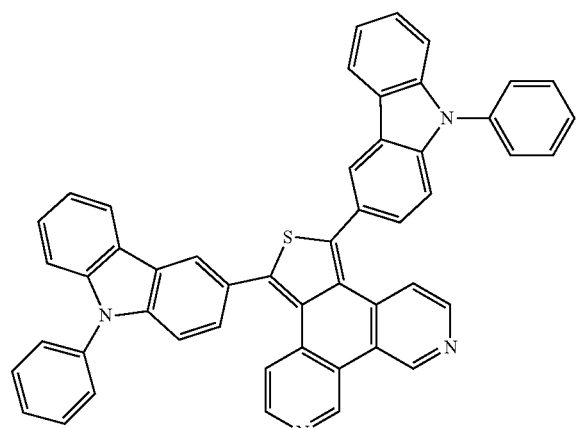
S-18
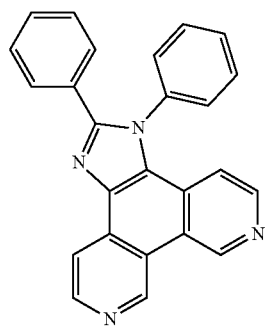
S-19
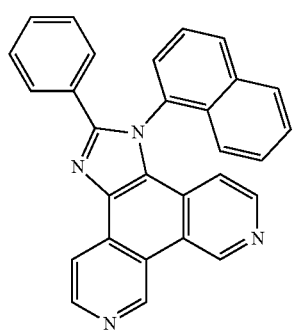
S-20
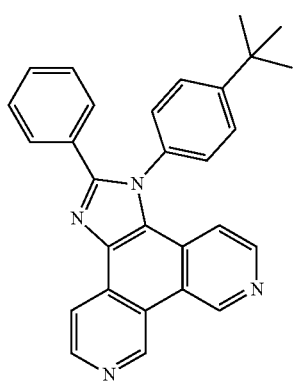
S-21
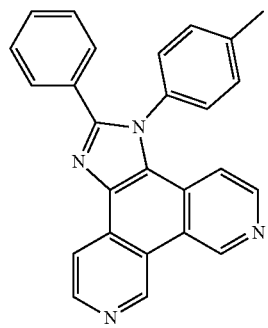
S-22
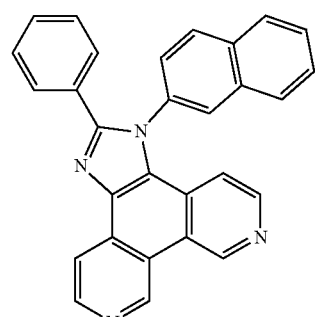
S-23
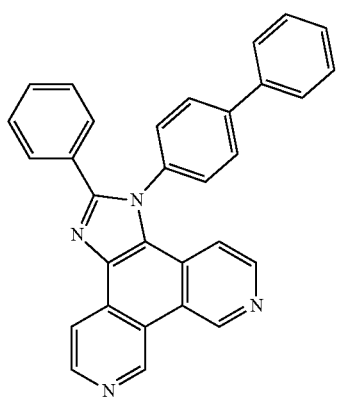
S-24
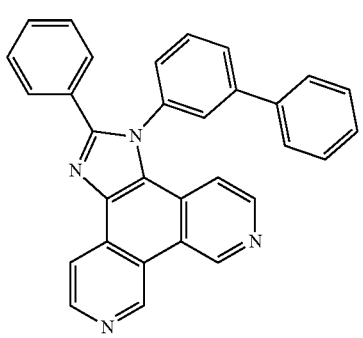

S-25 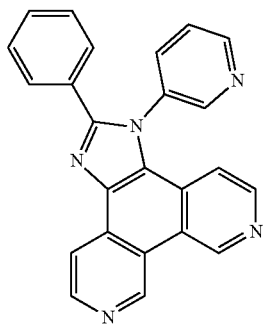
S-26 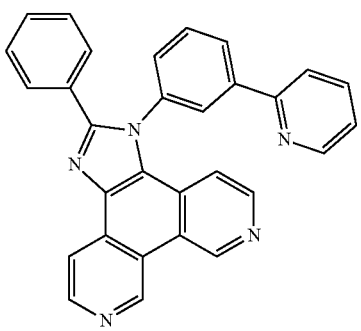
S-27 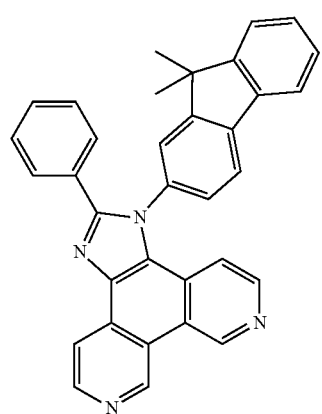
S-28
S-29 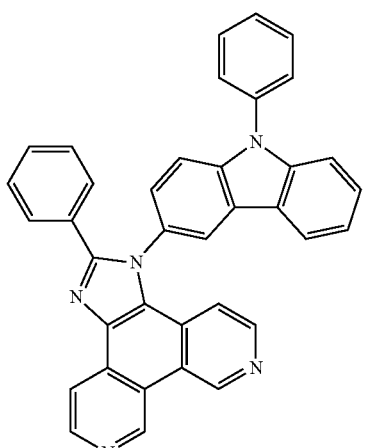
S-30 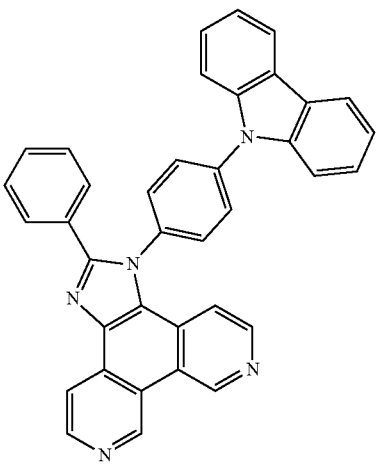
S-31 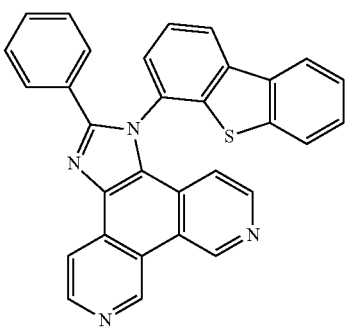

S-32 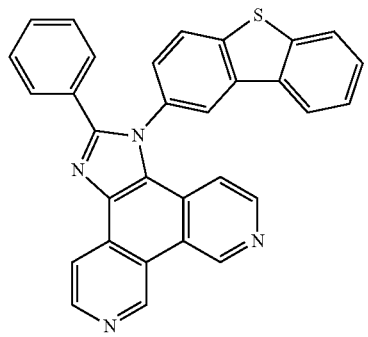
S-36 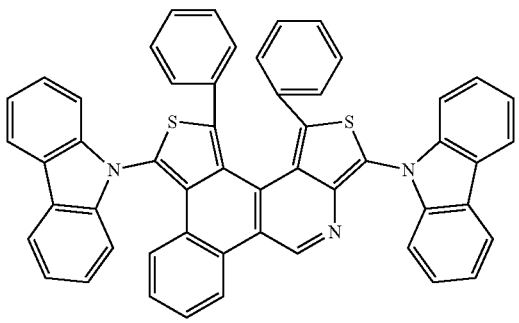
S-33 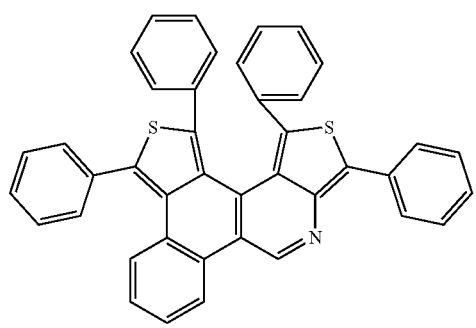
S-37 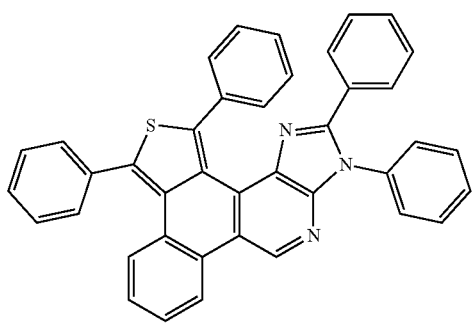
S-34 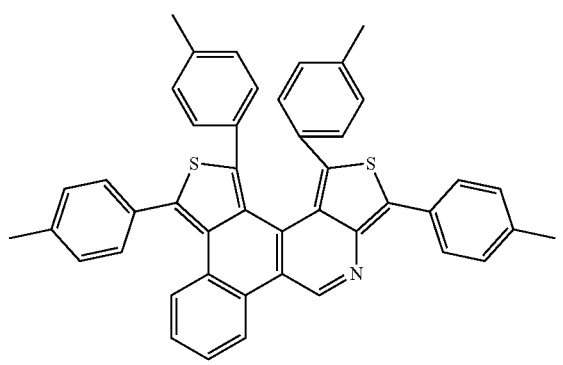
S-38 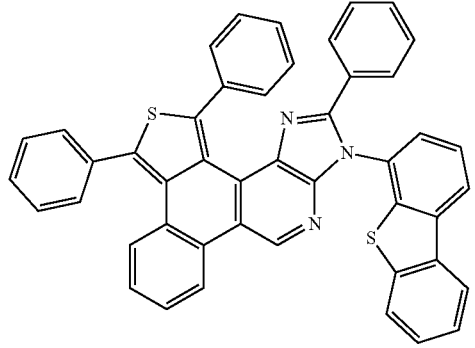
S-35 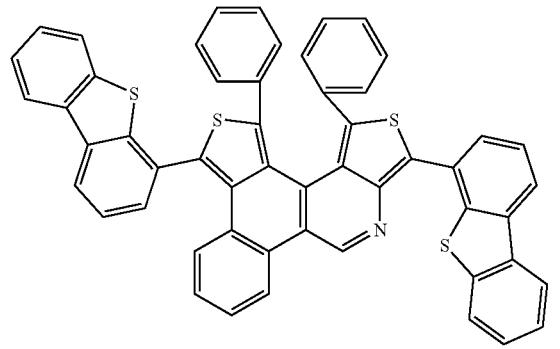
S-39 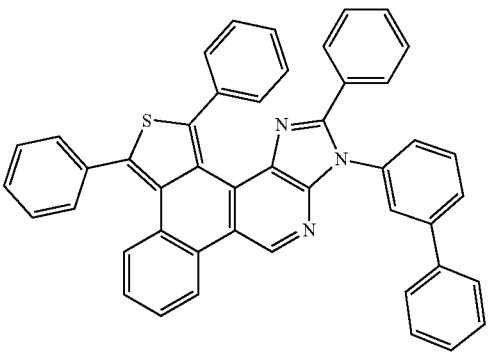

S-40

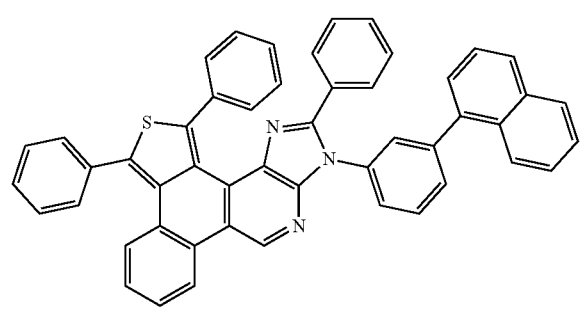

S-42

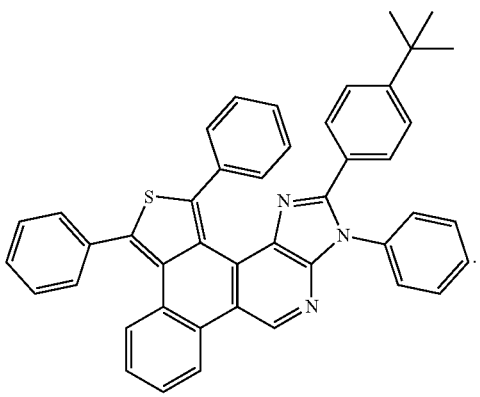

S-41

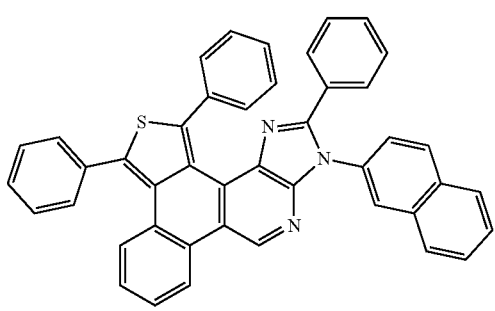

17. An organic light-emitting device comprising:
  a first electrode;
  a second electrode; and
  an organic layer disposed between the first electrode and the second electrode,
  wherein the organic layer comprises the compound of claim 1.

18. The organic light-emitting device of claim 17, wherein the organic layer is an emission layer.

19. A flat display apparatus comprising the organic light-emitting device of claim 17, wherein the first electrode of the organic light-emitting device is electrically connected to a source electrode or a drain electrode of a thin film transistor.

* * * * *